US012615899B2

(12) United States Patent
Jang et al.

(10) Patent No.: US 12,615,899 B2
(45) Date of Patent: Apr. 28, 2026

(54) LIGHT EMITTING DEVICE AND DISPLAY APPARATUS HAVING THE SAME

(71) Applicant: SEOUL VIOSYS CO., LTD., Ansan-si (KR)

(72) Inventors: Seong Kyu Jang, Ansan-si (KR); Seom Geun Lee, Ansan-si (KR); Yong Woo Ryu, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/760,330

(22) Filed: Jul. 1, 2024

(65) Prior Publication Data

US 2024/0355867 A1      Oct. 24, 2024

Related U.S. Application Data

(63) Continuation of application No. 17/318,475, filed on May 12, 2021, now Pat. No. 12,040,344.

(60) Provisional application No. 63/031,361, filed on May 28, 2020.

(51) Int. Cl.
H10H 29/10      (2025.01)
H10H 20/01      (2025.01)
H10H 20/857      (2025.01)

(52) U.S. Cl.
CPC .......... H10H 29/10 (2025.01); H10H 20/857 (2025.01); H10H 20/0364 (2025.01)

(58) Field of Classification Search
CPC . H01L 27/15; H01L 33/62; H01L 2933/0066; H01L 25/0753; H01L 25/0756; H01L 25/167; H01L 27/156; H10H 29/10; H10H 20/857; H10H 20/0364

See application file for complete search history.

(56) References Cited

U.S. PATENT DOCUMENTS

| | | | | |
|---|---|---|---|---|
| 12,334,483 B2 * | 6/2025 | Lee | .................... | H10H 20/8312 |
| 12,356,760 B2 * | 7/2025 | Kim | .......................... | G02B 5/26 |
| 12,356,783 B2 * | 7/2025 | Kim | .................... | H10H 20/824 |
| 2019/0103510 A1 | 4/2019 | Cha et al. | | |
| 2019/0164944 A1 * | 5/2019 | Chae | .................... | H10H 20/018 |
| 2019/0198485 A1 * | 6/2019 | Chae | .................... | H10H 20/857 |
| 2020/0058825 A1 * | 2/2020 | Jang | .................... | H10H 20/816 |
| 2020/0144233 A1 * | 5/2020 | Lee | .................... | H10H 20/813 |
| 2020/0144326 A1 * | 5/2020 | Lee | .................... | H10H 20/857 |

(Continued)

FOREIGN PATENT DOCUMENTS

| | | |
|---|---|---|
| KR | 1020130061138 A | 6/2013 |
| KR | 1020160037060 A | 4/2016 |

(Continued)

OTHER PUBLICATIONS

International Search Report for International Application No. PCT/KR2021/006644, mailed Sep. 27, 2021.

*Primary Examiner* — Victor A Mandala
(74) *Attorney, Agent, or Firm* — Perkins Coie LLP

(57) ABSTRACT

A stacked light emitting device includes a first LED stack, a second LED stack disposed under the first LED stack, a third LED stack disposed under the second LED stack, and a plurality of pads disposed over the first LED stack. Each of the first, second, and third LED stacks has a light generation region and a peripheral region disposed around the light generation region. The plurality of pads is disposed on the peripheral region of the first LED stack.

15 Claims, 44 Drawing Sheets

(56) References Cited

U.S. PATENT DOCUMENTS

| | | | | |
|---|---|---|---|---|
| 2020/0144470 A1* | 5/2020 | Jang | ................... | H10H 20/8312 |
| 2020/0258872 A1* | 8/2020 | Lee | ..................... | H10H 20/813 |
| 2020/0266318 A1* | 8/2020 | Lee | .................... | H01L 25/0756 |
| 2020/0295228 A1* | 9/2020 | Jang | ..................... | H10H 20/857 |
| 2020/0373348 A1* | 11/2020 | Lee | ........................ | H10H 29/10 |
| 2021/0074889 A1* | 3/2021 | Jang | ..................... | H10H 20/816 |
| 2021/0202567 A1* | 7/2021 | Kim | ..................... | H10H 20/824 |
| 2021/0408101 A1* | 12/2021 | Lee | ................... | H10H 20/8312 |
| 2022/0406983 A1* | 12/2022 | Jang | ..................... | H10H 29/962 |
| 2023/0071708 A1* | 3/2023 | Jang | ..................... | H10H 20/852 |
| 2023/0143510 A1* | 5/2023 | Chae | ................... | H10H 20/018 |
| | | | | 257/89 |
| 2023/0299122 A1* | 9/2023 | Kim | ..................... | H10H 29/142 |
| | | | | 257/79 |
| 2025/0056952 A1* | 2/2025 | Chae | ..................... | H10H 20/82 |

FOREIGN PATENT DOCUMENTS

| | | | |
|---|---|---|---|
| KR | 1020180000973 A | 1/2018 | |
| WO | 2019112304 A1 | 6/2019 | |

* cited by examiner

FIG. 11B

LIGHT EMITTING DEVICE AND DISPLAY APPARATUS HAVING THE SAME

CROSS-REFERENCE OF RELATED APPLICATIONS

The Present Application is a continuation of U.S. patent application Ser. No. 17/318,475, filed on May 12, 2021, which claims priority to and the benefit of U.S. Provisional Application No. 63/031,361 filed on May 28, 2020. The aforementioned applications of which are incorporated herein by reference in their entireties.

TECHNICAL FIELD

Exemplary embodiments relate to an LED display apparatus implementing an image using a light emitting diode.

BACKGROUND

Recently, an LED display apparatus that directly implements an image using a light emitting diode has been developed. The LED display apparatus implements an image using LEDs of a small size, such as micro-scale inorganic semiconductor LEDs, and is expected to replace a conventional LCD display or OLED.

In general, a display apparatus implements various colors through mixture of blue, green and red light. In order to implement various images, the display apparatus includes a plurality of pixels, each of which includes sub-pixels corresponding to blue, green and red light, respectively. A color of a certain pixel is determined based on the colors of the sub-pixels so that images can be implemented by a combination of these pixels.

As LEDs can emit various colors depending upon materials thereof, it is possible to provide a display apparatus by arranging individual LED chips emitting blue, green and red light on a two-dimensional plane. However, when one LED chip is arranged in each sub-pixel, the number of LED chips may be increased, which may require excessive time for a mounting process during manufacture. Moreover, the sub-pixels are arranged on the two-dimensional plane in the display apparatus and therefore, a relatively large area is occupied by one pixel that includes the sub-pixels for blue, green, and red light.

In order to solve these drawbacks, a light emitting device having a stacked structure in which a blue LED, a green LED, and a red LED are stacked in a vertical direction has been developed. The stacked light emitting device can implement blue light, green light, and red light with a single chip, so that the number of light emitting devices required for a display apparatus can be reduced to ⅓ compared to a conventional one. Accordingly, it is possible to drastically reduce a mounting process time of the light emitting devices. An occurrence of defective devices after mounting may be reduced.

Light emitting devices are mounted in a group on a panel substrate using a surface mounting technique or similar techniques, and pads need to be formed on the light emitting devices for this purpose. However, in the stacked light emitting device, it is difficult to form the pads having a stable structure due to the vertically stacked structure. Moreover, a current density input to the LEDs needs to be increased to drive the LEDs under high external quantum efficiency. The current density can be increased by reducing an area of the light emitting device under a predetermined current, and the reduction of an area of the light emitting device makes it more difficult to form the pads.

SUMMARY

Exemplary embodiments provide a light emitting device having a stable structure suitable for surface mounting, and a display apparatus having the same.

Exemplary embodiments provide a light emitting device suitable for stably forming pads and a display apparatus having the same.

An exemplary embodiment provides a stacked light emitting device. The light emitting device includes a first LED stack, a second LED stack disposed under the first LED stack, a third LED stack disposed under the second LED stack, and a plurality of pads disposed over the first LED stack. Each of the first, second, and third LED stacks has a light generation region and a peripheral region disposed around the light generation region, and the plurality of pads is disposed on the peripheral region of the first LED stack.

As the pads are spaced apart from the light generation region and disposed on the peripheral region of the first LED stack, the pads may be formed on a relatively flat region. Accordingly, the pads may be formed relatively stable, and further, it is possible to provide pads suitable for surface mounting.

In the present disclosure, the light generation region refers to a region in which light is generated by injecting current into an active layer, and the peripheral region refers to a region located near the light generation region, but the peripheral region does not substantially generate light.

In at least one variant, both of the light generation region and the peripheral region of each of the first, second, and third LED stacks may include a first conductivity type semiconductor layer, an active layer, and a second conductivity type semiconductor layer.

In another variant, the peripheral region may be separated from the light generation region by an isolation region.

In further another variant, side surfaces of the first conductivity type semiconductor layers in the peripheral regions adjacent to the isolation regions may be inclined with respect to a vertical surface. Slopes of the side surfaces of the first conductivity type semiconductor layers in the peripheral regions may reflect light emitted from the light generation regions, thereby contributing to improvement of light extraction efficiency.

In another variant, the peripheral region may surround the light generation region, and the light generation regions of the first, second, and third LED stacks may be at least partially overlapped with one another.

In another variant, the light generation regions of the first, second, and third LED stacks may be overlapped with one another by 50% or more, 70% or more, and further, 90% or more.

In another variant, the light generation regions may have an area of 10% or less of a total area of the light emitting device. As such, the light emitting device is formed relatively large, and thus, it is possible to improve the external quantum efficiency by increasing a current density injected into the light generation region while it is easy to handle the light emitting device.

In another variant, the light generation regions may be disposed in a center of the light emitting device, and the pads may be disposed near edges of the light emitting device, respectively.

In another variant, the light emitting device may further include a first-1 connector and a first-2 connector electrically connected to first and second conductivity type semiconductor layers of the light generation region of the first LED stack, respectively, a second-1 connector and a second-2 connector electrically connected to the first and second conductivity type semiconductor layers of the light generation region of the second LED stack, respectively, and a third-1 connector and a third-2 connector electrically connected to the first and second conductivity type semiconductor layers of the light generation region of the third LED stack, respectively. The pads may be electrically connected to the light generation regions through the connectors.

In further another variant, the first-1 connector, the second-1 connector, and the third-1 connector may be electrically connected to one another, and the first-2 connector, the second-2 connector, and the third-2 connector may be electrically spaced apart from one another. Further, the pads may include a first pad electrically connected to the first-1 connector, the second-1 connector, and the third-1 connector, and second, third, and fourth pads electrically connected to the third-2 connector, the second-2 connector, and the first-2 connector, respectively.

In another variant, the light emitting device may further include a first-1 intermediary connector disposed on the peripheral region of the first LED stack, and a second intermediary connector disposed between the first LED stack and the second LED stack, and disposed on the peripheral region of the second LED stack. The first-1 intermediary connector may pass through the peripheral region of the LED stack to be electrically connected to the second intermediary connector, the second intermediary connector may pass through the peripheral region of the second LED stack to be electrically connected to the third-2 connector, and the second pad may be disposed on the first-1 intermediary connector.

In the present disclosure, an intermediary connector is located between a pad and a connector to electrically connect the pad to the connector. In particular, the intermediary connector assists electrical connection in the vertical direction. As such, the intermediary connectors are included, and thus, the light emitting device may be easily manufactured.

In further another variant, the light emitting device may further include a first-2 intermediary connector disposed on the peripheral region of the first LED stack, in which the first-2 intermediary connector may pass through the peripheral region of the first LED stack to be electrically connected to the second-2 connector, and the third pad may be disposed on the first-2 intermediary connector.

Meanwhile, the first pad may be disposed on the first-1 connector, and the fourth pad may be disposed on the first-2 connector.

In another variant, each of the first, second, and third LED stacks may include a single light generation region.

In another variant, each of the first, second, and third LED stacks may include a plurality of light generation regions. Furthermore, the pads may include first, second, third, and fourth pads, the light generation regions of the first LED stack may be connected in parallel to one another between the first pad and the fourth pad, the light generation regions of the second LED stack may be connected in parallel to one another between the first pad and the third pad, and the light generation regions of the third LED stack may be connected in parallel to one another between the first pad and the second pad.

Additionally, or alternatively, the light emitting device may further include a first-1 connector and a first-2 connector electrically connected to first and second conductivity type semiconductor layers of the light generation regions of the first LED stack, respectively, a second-1 connector and a second-2 connector electrically connected to the first and second conductivity type semiconductor layers of the light generation regions of the second LED stack, respectively, and a third-1 connector and a third-2 connector electrically connected to the first and second conductivity type semiconductor layers of the light generation regions of the third LED stack, respectively. The first, second, third, and fourth pads may be electrically connected to the light generation regions through the connectors.

In addition, the light emitting device may further include a first-1 intermediary connector and a first-2 intermediary connector disposed on the peripheral region of the first LED stack, and a second intermediary connector disposed on the peripheral region of the second LED stack. The first-1 intermediary connector may pass through the peripheral region of the first LED stack to be electrically connected to the second intermediary connector, the first-2 intermediary connector may pass through the peripheral region of the first LED stack to be electrically connected to the second-2 connector, and the second intermediary connector may pass through the second LED stack to be electrically connected to the third-2 connector.

In another variant, all of the light generation regions of the first, second, and third LED stacks may be configured to be independently driven.

In another variant, the light generation regions may be disposed so as to face one another in diagonal directions of the light emitting device.

Another exemplary embodiment provides a display apparatus which may include a circuit board, and a plurality of light emitting devices mounted on the circuit board. The light emitting devices may include a first LED stack, a second LED stack disposed under the first LED stack, a third LED stack disposed under the second LED stack, and a plurality of pads disposed over the first LED stack. Each of the first, second, and third LED stacks may have a light generation region and a peripheral region disposed around the light generation region. The plurality of pads may be disposed on the peripheral region of the first LED stack, and the plurality of pads may be bonded toward the circuit board.

DESCRIPTION OF DRAWINGS

FIGS. 5B, 6B, 7B, 8B, 9B, 10B, 11B, 12B, 13B, 14B, 15B, 16B, and 17B are schematic cross-sectional views taken along lines A-A' of FIGS. 5A, 6A, 7A, 8A, 9A, 10A, 11A, 12A, 13A, 14A, 15A, 16A, and 17A, respectively, where:

FIG. 5A illustrates that a light generation region is surrounded by a peripheral region;

FIG. 5B is a schematic cross-sectional view taken along line A-A' of FIG. 5A;

FIG. 6A illustrates that an isolation region ISO1 is formed along a periphery of the light generation region;

FIG. 6B illustrates a schematic cross-sectional view taken along line A-A' of FIG. 6A;

FIG. 7A illustrates that a first insulation layer is formed;

FIG. 7B is a schematic cross-sectional view taken along line A-A' of FIG. 7A;

FIG. 8A illustrates that a third-1 connector and a third-2 connector are formed on the first insulation layer;

FIG. 8B is a schematic cross-sectional view taken along line A-A' of FIG. 8A;

FIG. 9A illustrates that a second LED stack is attached on the third LED stack using a first adhesive;

FIG. 9B is a schematic cross-sectional view taken along line A-A' of FIG. 9A;

FIG. 10A illustrates that an isolation region ISO2 is formed along a periphery of the light generation region;

FIG. 10B is a schematic cross-sectional view taken along line A-A' of FIG. 10A;

FIG. 11A illustrates that a second insulation layer and a second transparent electrode are formed;

FIG. 11B is a schematic cross-sectional view taken along line A-A' of FIG. 11A;

FIG. 12A illustrates a second-1 connector, a second intermediary connector, and a second-2 connector are formed on the second insulation layer;

FIG. 12B is a schematic cross-sectional view taken along line A-A' of FIG. 12A;

FIG. 13A illustrates that a first LED stack is attached to the second LED stack using a second adhesive layer;

FIG. 13B is a schematic cross-sectional view taken along line A-A' of FIG. 13A;

FIG. 14A illustrates that the first conductivity type semiconductor layer, an active layer, and a second conductivity type semiconductor layer are patterned to expose the first transparent electrode;

FIG. 14B is a schematic cross-sectional view taken along line A-A' of FIG. 14A;

FIG. 15A illustrates forming an isolation region ISO3 which separates the peripheral region from the light generation region;

FIG. 15B is a schematic cross-sectional view taken along line A-A' of FIG. 15A;

FIG. 16A illustrates that a third insulation layer is formed;

FIG. 16B is a schematic cross-sectional view taken along line A-A' of FIG. 16A;

FIG. 17A illustrates that a protection insulation layer is formed;

FIG. 17B is a schematic cross-sectional view taken along line A-A' of FIG. 17A;

FIG. 18A illustrates a schematic plan view as viewed on a third LED stack;

FIG. 18B illustrates a schematic plan view as viewed on a second LED stack; and

FIG. 18C illustrates a schematic plan view as viewed on a first LED stack.

FIG. 19A illustrates that a first insulation layer includes openings;

FIG. 19B illustrates that a second insulation layer includes openings; and

FIG. 19C illustrates that a third insulation layer has openings exposing connectors.

FIG. 20A illustrates that the light emitting device has a plurality of light generation regions;

FIG. 20B illustrates that a second insulation layer includes openings; and

FIG. 20C illustrates that a third insulation layer has openings exposing connectors.

DETAILED DESCRIPTION OF EMBODIMENTS

Figure 1:
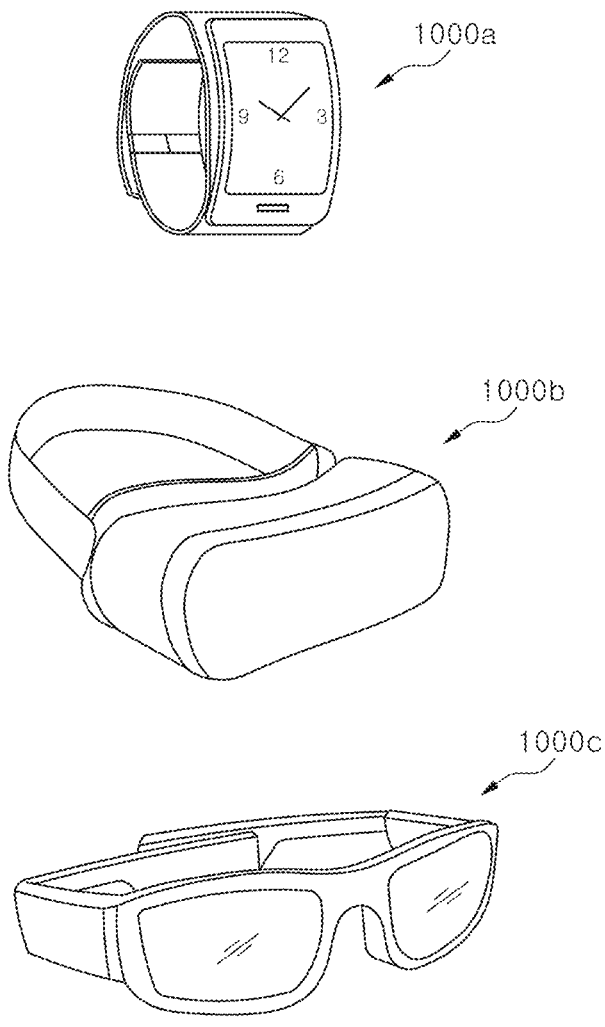
FIG. 1 shows schematic perspective views illustrating display apparatuses according to exemplary embodiments.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

Hereinafter, exemplary embodiments of the inventive concepts will be described in detail with reference to the accompanying drawings. FIG. 1 shows schematic perspective views illustrating display apparatuses according to exemplary embodiments.

A light emitting device according to the exemplary embodiment is not particularly limited, but, particularly, it may be used in a VR display apparatus such as a smart watch 1000a or a VR headset 1000b, or an AR display apparatus such as augmented reality glasses 1000c. In addition, the light emitting device of the present disclosure may be used in various sizes of TVs and head-up display apparatuses of automobiles.

Figure 2:
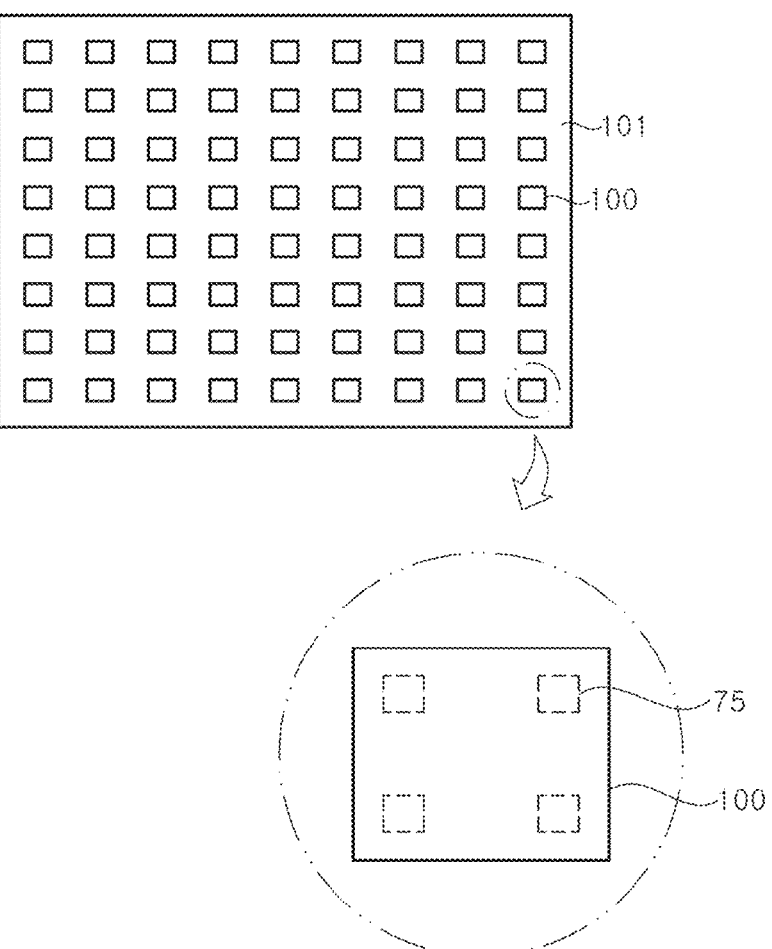
FIG. 2 is a schematic plan view illustrating a display panel according to an exemplary embodiment.

A display panel for implementing an image is mounted in the display apparatus. FIG. 2 is a schematic plan view illustrating the display panel according to an exemplary embodiment.

Referring to FIG. 2, the display panel includes a circuit board 101 and light emitting devices 100. The circuit board 101 may include a circuit for passive matrix driving or active matrix driving. In an exemplary embodiment, the circuit board 101 may include interconnection lines and resistors therein. In another exemplary embodiment, the circuit board 101 may include interconnection lines, transistors, and capacitors. The circuit board 101 may also have pads disposed on an upper surface thereof to allow electrical connection to the circuit therein.

The plurality of light emitting devices 100 is arranged on the circuit board 101. Each of the light emitting devices 100 constitutes one pixel. The light emitting device 100 has bump pads 75, and the bump pads 75 are electrically connected to the circuit board 101. For example, the bump pads 75 may be bonded to pads exposed on the circuit board 101.

Figure 3A:
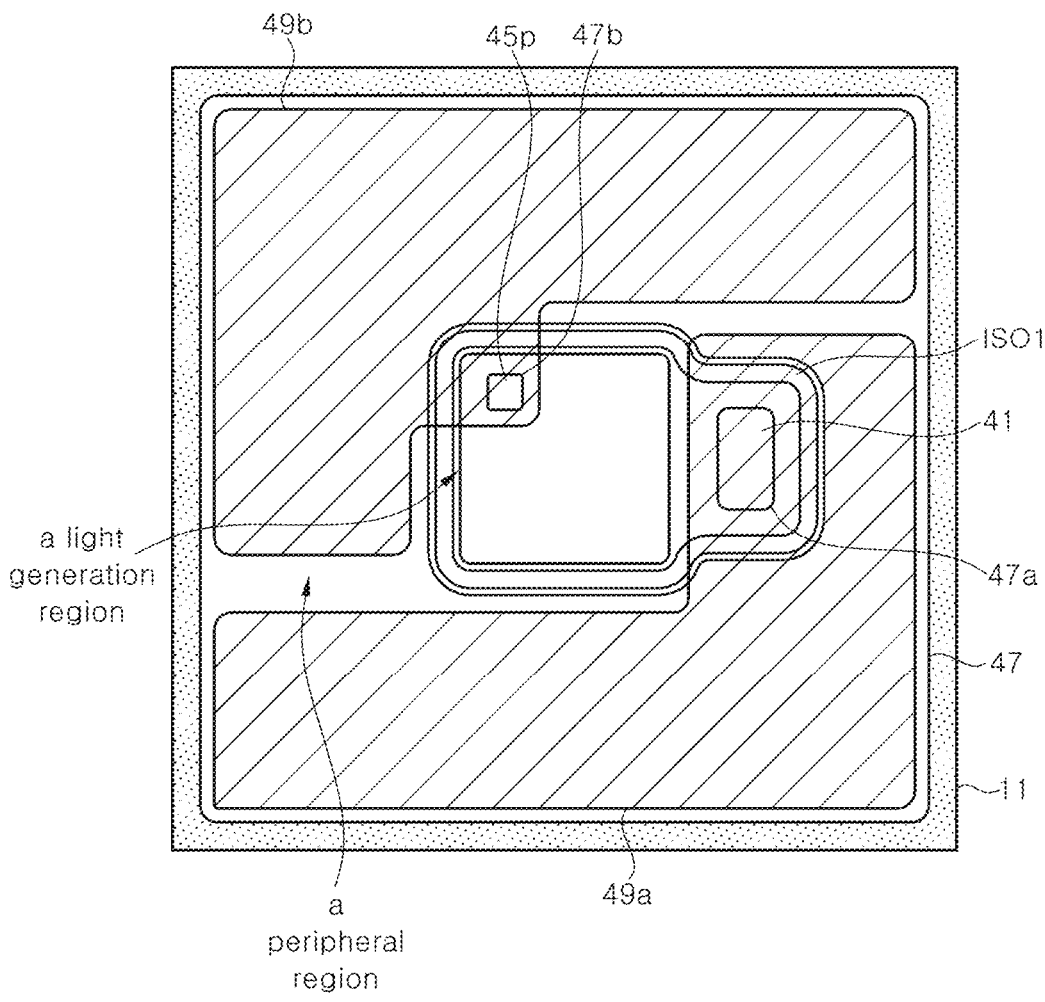
FIG. 3A is a schematic plan view as viewed on a third LED stack to illustrate a light emitting device according to an exemplary embodiment.
Figure 3B:
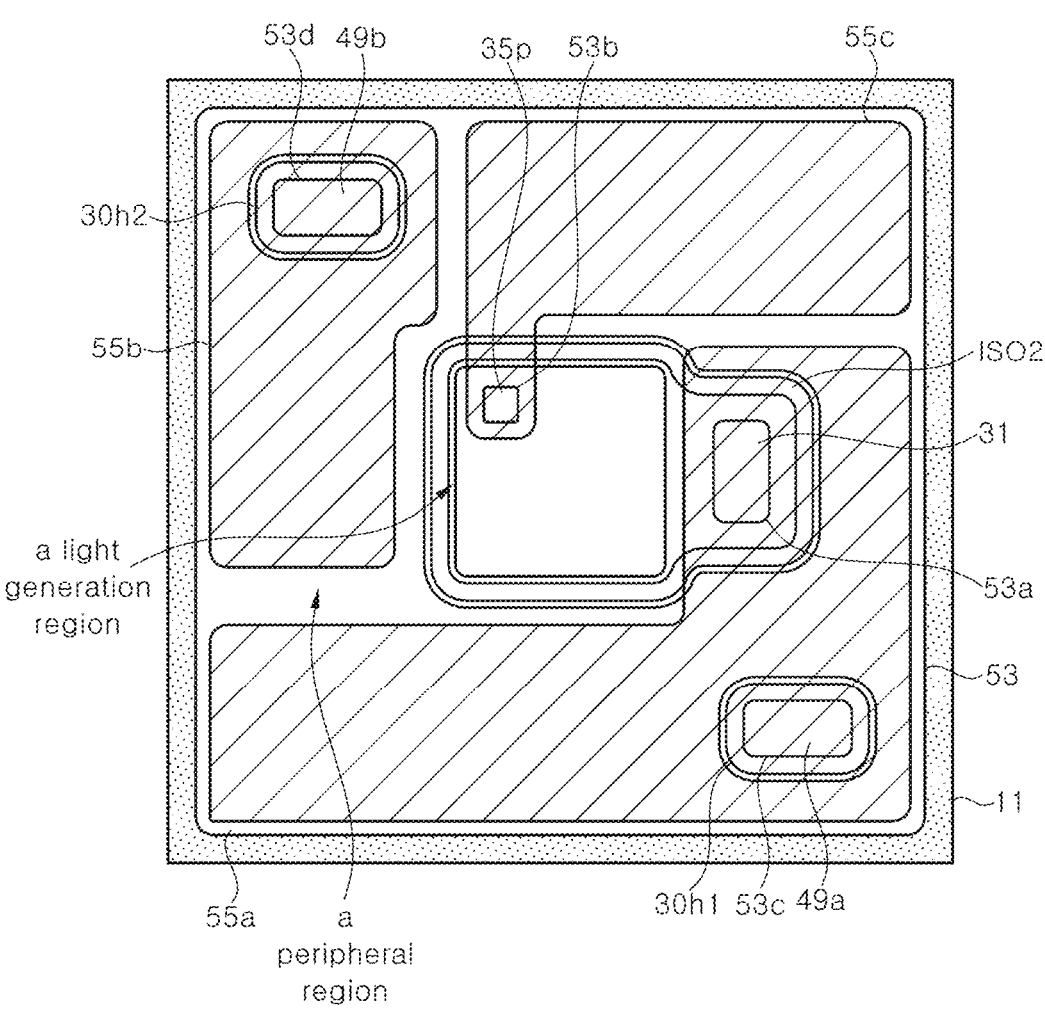
FIG. 3B is a schematic plan view as viewed on a second LED stack to illustrate a light emitting device according to an exemplary embodiment.
Figure 3C:
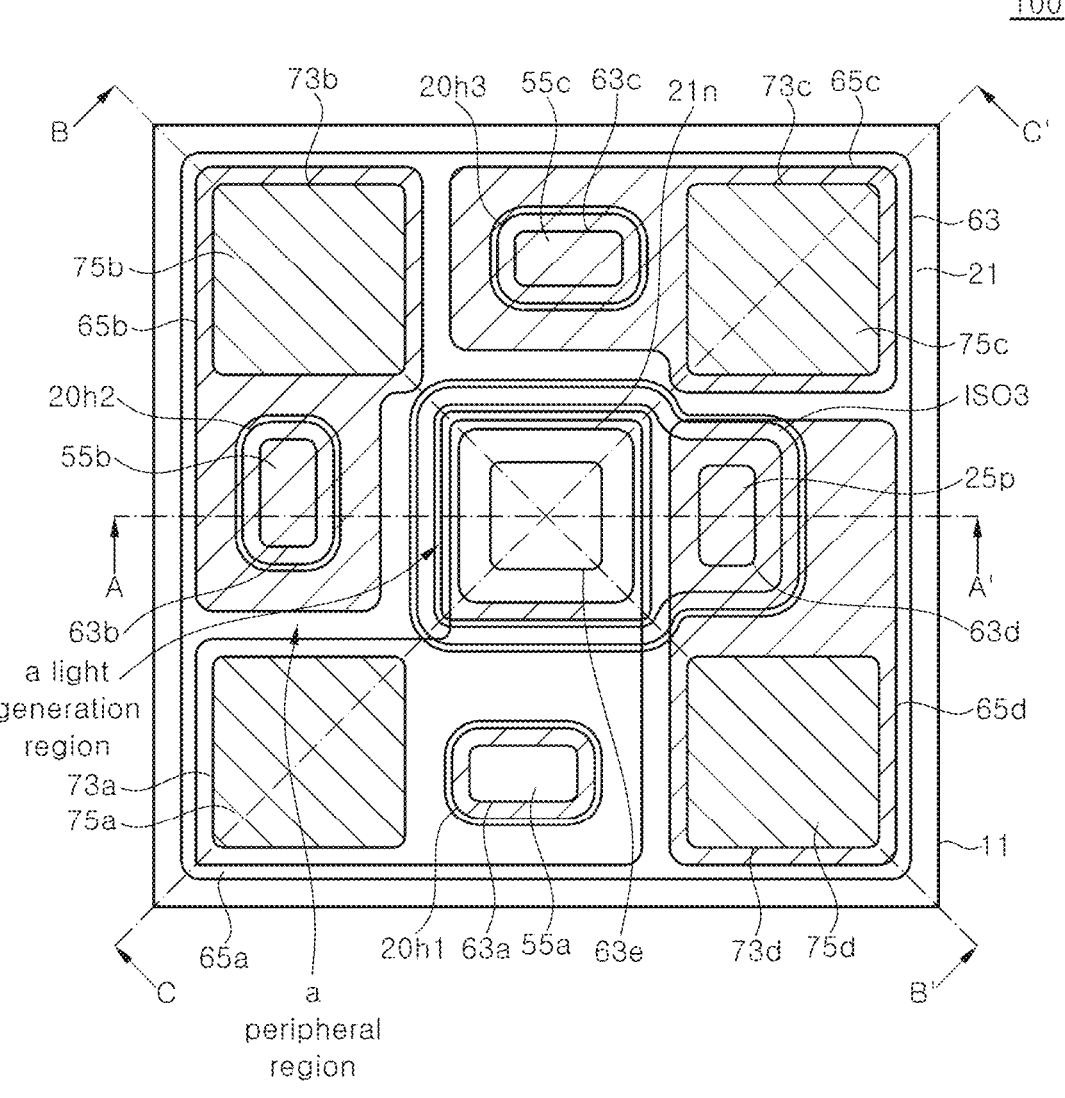
FIG. 3C is a schematic plan view as viewed on a first LED stack to illustrate a light emitting device according to an exemplary embodiment.
Figure 4A:
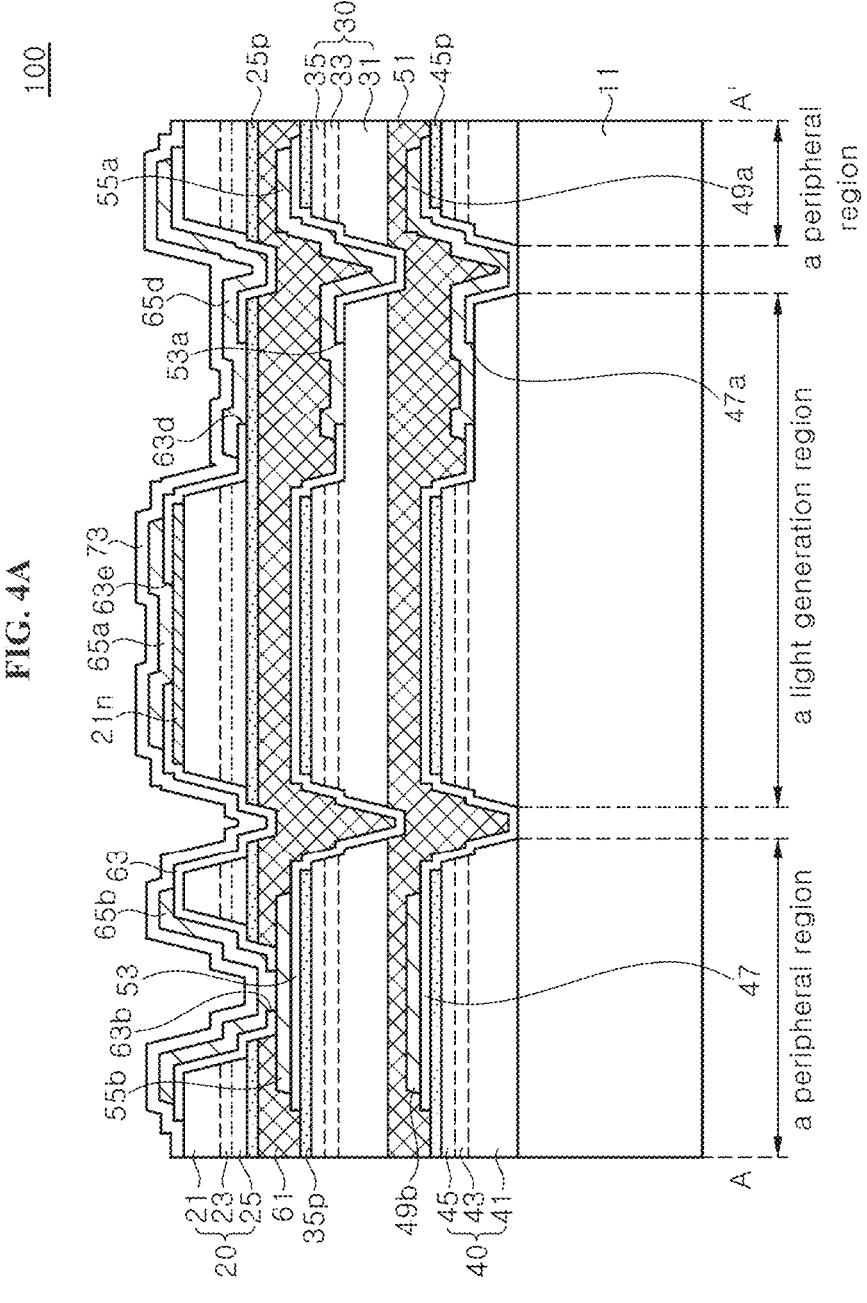
FIG. 4A, is a schematic cross-sectional views taken along line A-A' of FIG. 3C.
Figure 4B:
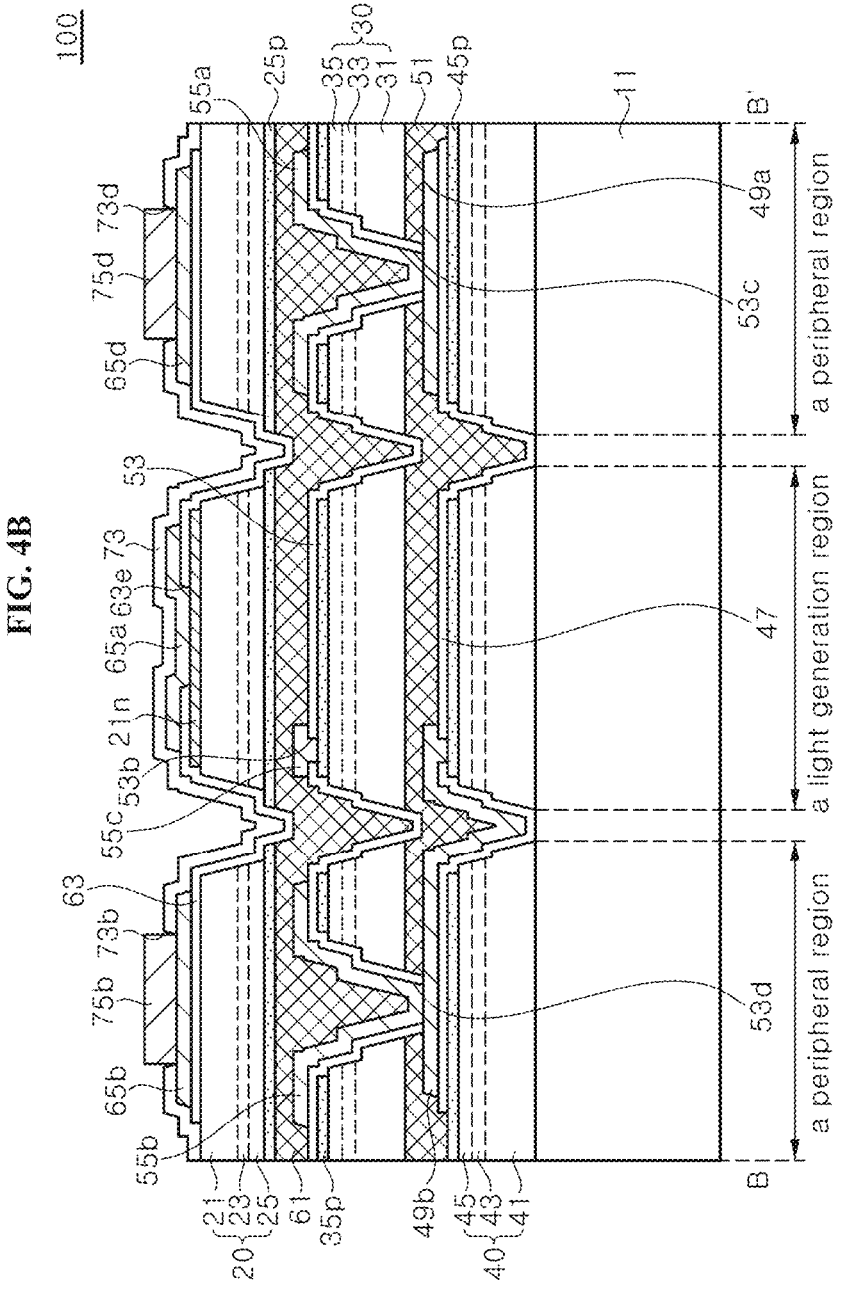
FIG. 4B illustrates a schematic cross-sectional views taken along line B-B' of FIG. 3C.
Figure 4C:
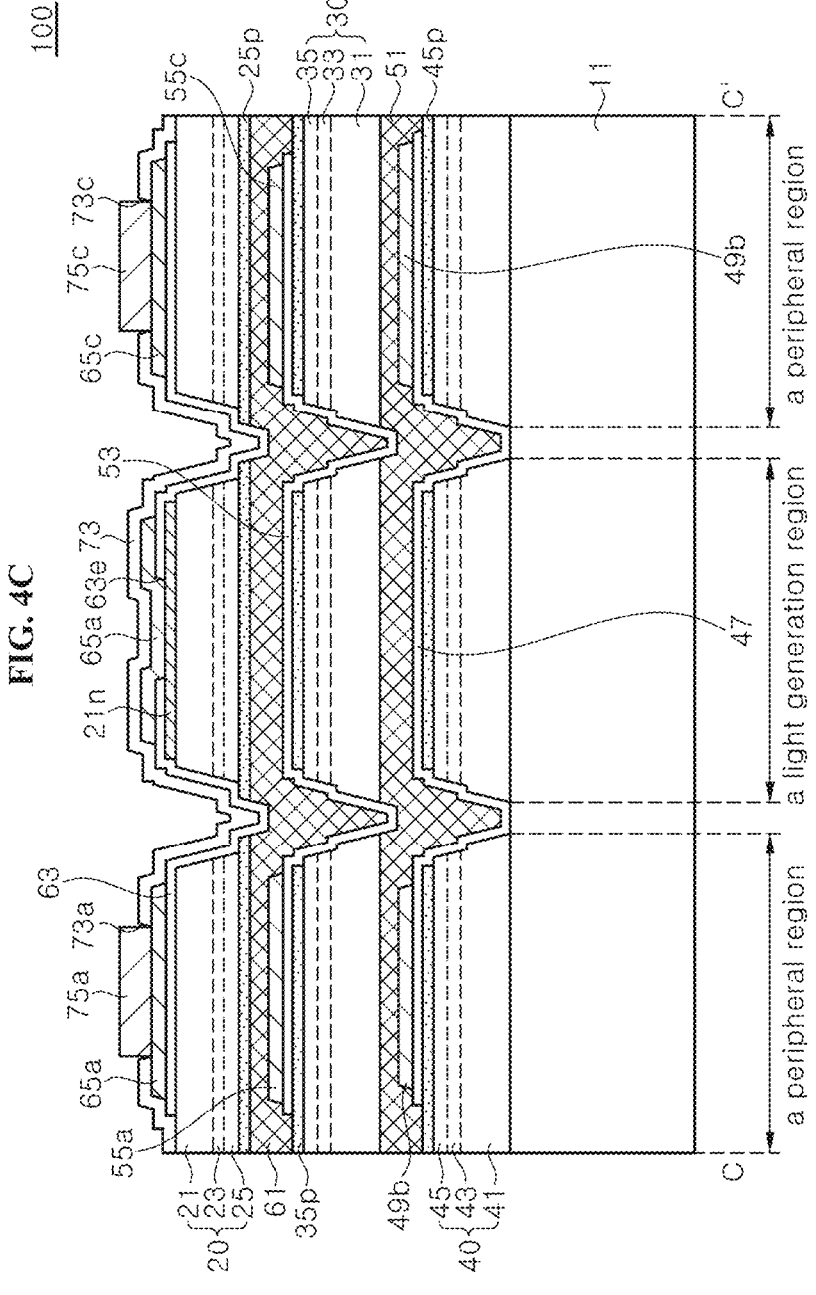
FIG. 4C illustrates a schematic cross-sectional views taken along line C-C' of FIG. 3C.

A specific configuration of the light emitting device 100 will be described in detail below. FIGS. 3A, 3B, and 3C are schematic plan views illustrating the light emitting device 100 according to an exemplary embodiment, FIG. 3A is a schematic plan view as viewed on a third LED stack, FIG. 3B is a schematic plan view as viewed on a second LED stack, and FIG. 3C is a schematic plan view as viewed on a first LED stack. FIGS. 4A, 4B, and 4C are schematic cross-sectional views taken along lines A-A', B-B', and C-C' of FIG. 3C, respectively.

Referring to FIGS. 3A, 3B, 3C, 4A, 4B, and 4C, the light emitting device 100 according to an exemplary embodiment may include a substrate 11, a first LED stack 20, a second LED stack 30, a third LED stack 40, a first transparent electrode 25p, a second transparent electrode 35p, a third transparent electrode 45p, a first ohmic electrode 21n, a first adhesive layer 51, a second adhesive layer 61, insulation layers 47, 53, 63, and 73, connectors 49a, 49b, 55a, 55c, 65a, and 65d, intermediary connectors 55b, 65b, and 65c, and bump pads 75a, 75b, 75c, and 75d.

The light emitting device 100 may have an area of 500 μm×500 μm or less, further, 300 μm×300 μm or less, more specifically 200 μm×200 μm or less. A micro LED generally refers to a light emitting device having a lateral area of 100 μm×100 μm or less. However, the light emitting device 100 according to the exemplary embodiment may have an area larger than 100 μm×100 μm. Meanwhile, the light emitting device 100 includes a light generation region and a peripheral region. The light generation region emits light suitable for implementing an image, and the peripheral region does not substantially generate light. Herein, the light generation region may have a size suitable for being referred to as the micro LED, that is, an area of 100 μm×100 μm or less, and further, may have a size of 60 μm×60 μm or less. The light generation region may have an area of 10% or less of an area of the light emitting device 100, for example. Since the size of the light emitting device 100 is set to be relatively large while the size of the light generation region is reduced, handling of the light emitting device 100 may be assisted, and further, the current density in the light generation region may be increased, thereby increasing the external quantum efficiency of the light emitting device.

The substrate 11 may be a transparent substrate capable of transmitting light. In some exemplary embodiments, the substrate 11 may be formed to transmit light of a selected specific wavelength or to transmit a portion of light of a specific wavelength. The substrate 11 may be a growth substrate to grow a semiconductor layer, and for example, may be a growth substrate used for epitaxial growth of the third LED stack 40, for example, a sapphire substrate. The substrate 11 is not limited to a sapphire substrate, and may include various other transparent substrates. For example, the substrate 11 may include glass, quartz, silicon, an organic polymer, or an organic-inorganic composite material, and examples thereof may include silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. Further, the substrate 11 may include irregularities on an upper surface thereof, and may be, for example, a patterned sapphire substrate. By including the irregularities on the upper surface of the substrate 11, it is possible to increase extraction efficiency of light generated in the third light emitting stack 40 which is in contact with the substrate 11. The irregularities of the substrate 11 may be included to selectively increase luminous intensity of the third light emitting stack 40 compared to those of the first light emitting stack 20 and the second light emitting stack 30. In another exemplary embodiment, the substrate 11 may be removed. When the substrate 11 is removed, the substrate 11 is not required to be a transparent substrate.

The first, second, and third LED stacks 20, 30, and 40 are configured to emit light towards the substrate 11. Accordingly, light emitted from the first LED stack 20 may pass through the second and third LED stacks 30 and 40. According to an exemplary embodiment, the first, second, and third LED stacks 20, 30, and 40 may emit light having different peak wavelengths from one another. In an exemplary embodiment, the LED stack far from the substrate 11 may reduce light loss by emitting light of a longer wavelength compared to the LED stack close to the substrate 11. For example, the first LED stack 20 may emit red light, the second LED stack 30 emits green light, and the third LED stack 40 may emit blue light.

In another exemplary embodiment, the second LED stack 30 may emit light of a shorter wavelength than that of the third LED stack 40. As such, it is possible to reduce a luminous intensity of the second LED stack 30 and increase a luminous intensity of the third LED stack 40, and thus, a luminous intensity ratio of light emitted from the first, second, and third LED stacks may be adjusted. For example, the first LED stack 20 may be configured to emit red light, the second LED stack 30 may be configured to emit blue light, and the third LED stack 40 may be configured to emit green light. Accordingly, a luminous intensity of blue light may be relatively reduced and a luminous intensity of green light may be relatively increased, and thus, the luminous intensity ratio of red, green, and blue light may be easily adjusted to be close to 3:6:1.

Hereinafter, it is described by way of example that the second light emitting stack 30 emits light of a shorter wavelength than that of the third light emitting stack 40, such as blue light. However, it should be noted that the second light emitting stack 30 emits light of a longer wavelength than that of the third light emitting stack 40, such as green light.

The first light emitting stack 20 includes a first conductivity type semiconductor layer 21, an active layer 23, and a second conductivity type semiconductor layer 25. According to an exemplary embodiment, the first light emitting stack 20 may include a semiconductor material such as AlGaAs, GaAsP, AlGaInP, and GaP that emits red light, but the inventive concepts are not limited thereto.

The first LED stack 20 includes a light generation region and a peripheral region. Both the light generation region and the peripheral region may include the first conductivity type semiconductor layer 21, the active layer 23, and the second conductivity type semiconductor layer 25. An upper surface of the light generation region may be disposed at an identical elevation as that of the peripheral region. However, the light generation region is configured to generate light in the active layer 23, and the peripheral region is not required to generate light in the active layer 23. Further, the peripheral region does not substantially generate light. In an exemplary embodiment, the peripheral region may be separated from the light generation region by an isolation region ISO3 (FIG. 3C).

The first ohmic electrode 21*n* may be disposed on the first conductivity type semiconductor layer 21 in the light generation region and may form an ohmic contact with the first conductivity type semiconductor layer 21. The first ohmic electrode 21*n* may have a single layer structure or a multiple layer structure, and may include Al, Ti, Cr, Ni, Au, Ag, Sn, W, Cu, or alloys thereof such as Au—Te alloy or Au—Ge alloy, but the inventive concepts are not limited thereto. In some forms, the first ohmic electrode 21*n* may have a thickness of about 100 nm, and may include a metal having high reflectivity to increase light emission efficiency in a downward direction toward the substrate 11.

In an exemplary embodiment, a portion of the first conductivity type semiconductor layer 21 in the light generation region may be patterned and recessed, and the first ohmic electrode 21*n* may be disposed in a recessed region of the first conductivity type semiconductor layer 21 to increase an ohmic contact level.

The first transparent electrode 25*p* may be in ohmic contact with the second conductivity type semiconductor layer 25. The first transparent electrode 25*p* may be disposed under the second conductivity type semiconductor layer 25. As shown in FIG. 4A, a portion of the first transparent electrode 25*p* may extend in the lateral direction from the lower surface of the light generation region. In addition, as shown in FIGS. 4A, 4B, and 4C, the first transparent electrode 25*p* may contact the second conductivity type semiconductor layer 25 in not only the light generation region but also in the peripheral region. However, the inventive concepts are not limited thereto, and the first transparent electrode 25*p* may not contact the second conductivity type semiconductor layer 25 of the peripheral region. The first transparent electrode 25*p* may be formed of a material layer that transmits light generated in the first LED stack 20.

The second LED stack 30 includes a first conductivity type semiconductor layer 31, an active layer 33, and a second conductivity type semiconductor layer 35. In some forms, the second LED stack 30 may include a semiconductor material emitting blue light such as GaN, InGaN, ZnSe, or the like, but the inventive concepts are not limited thereto. The second LED stack 30 may also include a light generation region and a peripheral region, and the peripheral region may be separated from the light generation region by an isolation region ISO2 (FIG. 3B). A portion of the first conductivity type semiconductor layer 31 may be exposed around the light generation region. For example, a mesa including the active layer 33 and the second conductivity type semiconductor layer 35 may be formed on the first conductivity type semiconductor layer 31, the light generation region is defined by the mesa, and an upper surface of the first conductivity type semiconductor layer 31 around the mesa may be exposed.

Meanwhile, a side surface of the peripheral region surrounding the light generation region may be inclined with respect to a vertical surface. The inclined side surface of the peripheral region of the second LED stack 30 reflects light generated in the first LED stack 20 toward the substrate 11 to improve light extraction efficiency.

The second transparent electrode 35*p* is disposed on the second conductivity type semiconductor layer 35 of the second LED stack 30. As shown in FIGS. 4A, 4B, and 4C, the second transparent electrode 35*p* may be disposed not only on the light generation region but also on the peripheral region. However, the inventive concepts are not limited thereto, and the second transparent electrode 35*p* may be disposed limitedly on the light generation region. The second transparent electrode 35*p* may be formed of a material layer that transmits light generated in the first LED stack 20.

The third LED stack 40 includes a first conductivity type semiconductor layer 41, an active layer 43, and a second conductivity type semiconductor layer 45. In some forms, the third LED stack 40 may include a semiconductor material emitting green light such as GaN, InGaN, GaP, AlGaInP, AlGaP, or the like, but the inventive concepts are not limited thereto. The third LED stack 40 may also include a light generation region and a peripheral region, and the peripheral region may be separated from the light generation region by an isolation region ISO1 (FIG. 3A). A portion of the first conductivity type semiconductor layer 41 may be exposed around the light generation region. For example, a mesa including the active layer 43 and the second conductivity type semiconductor layer 45 may be formed on the first conductivity type semiconductor layer 41, the light generation region may be defined by the mesa, and an upper surface of the first conductivity type semiconductor layer 41 around the mesa may be exposed. Meanwhile, a side surface of the peripheral region surrounding the light generation region may be inclined with respect to a vertical surface. The inclined side surface of the peripheral region of the third LED stack 40 reflects light generated in the first and second LED stacks 20 and 30 toward the substrate 11 to improve light extraction efficiency.

The third transparent electrode 45*p* is disposed on the second conductivity type semiconductor layer 45 of the third LED stack 40. As shown in FIGS. 4A, 4B, and 4C, the third transparent electrode 45*p* may be disposed not only on the light generation region but also on the peripheral region. However, the inventive concepts are not limited thereto, and the third transparent electrode 45*p* may be disposed limitedly on the light generation region. The third transparent electrode 45*p* may be formed of a material layer that transmits light generated in the first and second LED stacks 20 and 30.

According to an exemplary embodiment, each of the first conductivity type semiconductor layers 21, 31, and 41 and the second conductivity type semiconductor layer 25, 35, and 45 of the first, second, and third LED stacks 20, 30, and 40 may have a single layer structure or a multiple layer structure, and in some exemplary embodiments, may include a superlattice layer. Moreover, the active layers 23, 33, and 43 of the first, second, and third LED stacks 20, 30, and 40 may have a single quantum well structure or a multiple quantum well structure.

Meanwhile, the light generation regions of the first, second, and third LED stacks 20, 30, and 40 may be at least partially overlapped with one another. As shown in FIGS. 3A, 3B, and 3C, the light generation regions of the first, second, and third LED stacks 20, 30, and 40 may be overlapped with one another by about 50% or more, further, 70% or more, and furthermore, about 90% or more.

Each of the first, second, and third transparent electrodes 25*p*, 35*p*, and 45*p* may include a transparent conductive material that transmits light. For example, the first, second, and third transparent electrodes 25*p*, 35*p*, and 45*p* may include a transparent conductive oxide (TCO), such as SnO, $InO_2$, ZnO, ITO, ITZO, or the like, but the inventive concepts are not limited thereto.

The first adhesive layer 51 is disposed between the second LED stack 30 and the third LED stack 40, and the second adhesive layer 61 is disposed between the first LED stack 20 and the second LED stack 30. The first and second adhesive layers 51 and 61 may include a non-conductive material that transmits light. For example, the first and second adhesive layers 51 and 61 may include an optically transparent adhesive (OCA), for example, epoxy, polyimide, SU8, spin-on-glass (SOG), or benzocyclobutene (BCB), but the inventive concepts are not limited thereto.

The first insulation layer 47 covers the third LED stack 40. As shown in FIGS. 3A, 4A, and 4B, the first insulation layer 47 may have an opening 47a exposing the first conductivity type semiconductor layer 41 near the light generation region of the third LED stack 40 and an opening 47b exposing the third transparent electrode 45p on the light generation region. In addition, as shown in FIGS. 3A and 4A, the first insulation layer 47 may expose the second conductivity type semiconductor layer 45 or the third transparent electrode 45p near an edge of the peripheral region.

The third-1 connector 49a and the third-2 connector 49b are disposed on the first insulation layer 47. The third-1 connector 49a and the third-2 connector 49b are electrically connected to the first conductivity type semiconductor layer 41 and the second conductivity type semiconductor layer 45 in the light generation region, respectively. For example, as shown in FIG. 3A, the third-1 connector 49a may be electrically connected to the first conductivity type semiconductor layer 41 through the opening 47a, and the third-2 connector 49b may be electrically connected to the third transparent electrode 45p through the opening 47b.

As shown in FIG. 3A, the third-1 connector 49a may be laterally spaced apart from the light generation region so as not to be overlapped with the light generation region of the third LED stack 40. Meanwhile, the third-2 connector 49b may be partially overlapped with the light generation region to be electrically connected to the light generation region of the third LED stack 40. Most of regions of the third-1 connector 49a and the third-2 connector 49b are disposed on the peripheral region of the third LED stack 40.

Meanwhile, as shown in FIG. 3B, the second LED stack 30 may include through holes 30h1 and 30h2 passing through the peripheral region. The through holes 30h1 and 30h2 pass through the first adhesive layer 51 to expose the third-1 connector 49a and the third-2 connector 49b, respectively.

The second insulation layer 53 covers the second LED stack 30. As shown in FIGS. 3B and 4A, the second insulation layer 53 may have an opening 53a exposing the first conductivity type semiconductor layer 31 near the light generation region of the second LED stack 30 and an opening 53b exposing the second transparent electrode 35p on the light generation. Further, as shown in FIGS. 3B and 4B, the second insulation layer 53 may have openings 53c and 53d exposing the third-1 connector 49a and the third-2 connector 49b in the through holes 30h1 and 30h2. In addition, as shown in FIGS. 3B and 4A, the second insulation layer 53 may expose the second conductivity type semiconductor layer 35 or the second transparent electrode 35p near an edge of the peripheral region.

The second-1 connector 55a, the second intermediary connector 55b, and the second-2 connector 55c may be disposed on the second insulation layer 53. As shown in FIG. 3B, the second-1 connector 55a, the second intermediary connector 55b, and the second-2 connector 55c are disposed to be spaced apart from one another in the lateral direction. Moreover, the second-1 connector 55a and the second intermediary connector 55b are spaced apart from the light generation region of the second LED stack 30 in the lateral direction and may not be overlapped with the light generation region of the second LED stack 30.

The second-1 connector 55a and the second-2 connector 55c are electrically connected to the first conductivity type semiconductor layer 31 and the second conductivity type semiconductor layer 35 in the light generation region, respectively. For example, the second-1 connector 55a may be electrically connected to the first conductivity type semiconductor layer 31 through the opening 53a, and the second-2 connector 55c may be electrically connected to the second transparent electrode 35p through the opening 53b.

Further, the second-1 connector 55a may be electrically connected to the third-1 connector 49a through the through hole 30h1 and the opening 53c, and the second intermediary connector 55b may be electrically connected to the third-2 connector 49b through the through hole 30h2 and the opening 53d.

In the illustrated exemplary embodiment, the opening 53b of the second insulation layer 53 may be formed to be overlapped with the opening 47b of the first insulation layer 47. Accordingly, a portion where the second-2 connector 55c is connected to the second transparent electrode 35p may be overlapped with a portion where the third-2 connector 49b is connected to the third transparent electrode 45p. Accordingly, a region covered with the second-2 connector 55c and the third-2 connector 49b among the light generation regions may be reduced.

Meanwhile, as shown in FIG. 3C, the first LED stack 20 may include through holes 20h1, 20h2, and 20h3 in the peripheral region. The through holes 20h1, 20h2, and 20h3 may pass through the second adhesive layer 61 to expose the second-1 connector 55a, the second intermediary connector 55b, and the second-2 connector 55c, respectively.

The third insulation layer 63 covers the first LED stack 20. As shown in FIGS. 3C and 4B, the third insulation layer 63 may have openings 63a, 63b, and 63c exposing the second-1 connector 55a, the second intermediary connector 55b, and the second 2 connector 55c in the through holes 20h1, 20h2, and 20h3. Further, the third insulation layer 63 may have an opening 53d exposing the first transparent electrode 25p near the light generation region of the first LED stack 20 and an opening 53e exposing the first ohmic electrode 21n on the light generation region. Moreover, as shown in FIGS. 3C and 4A, the third insulation layer 63 may expose the first conductivity type semiconductor layer 21 near the edge of the peripheral region.

According to the illustrated exemplary embodiment, at least one of the first insulation layer 47, the second insulation layer 53, and the third insulation layer 63 may include various organic or inorganic insulating materials, such as polyimide, $SiO_2$, $SiN_x$, $Al_2O_3$, or the like. At least one of the first, second, and third insulation layers 47, 53, and 63 may have a single layer structure or a multiple layer structure formed of two or more insulation layers having different refractive indices from one another. For example, the third insulation layer 63 may include a distributed Bragg reflector (DBR).

The first-1 connector 65a, the first-1 intermediary connector 65b, the first-2 intermediary connector 65c, and the first-2 connector 65d are disposed on the third insulation layer 63. As shown in FIG. 3C, the first-1 connector 65a, the first-1 intermediary connector 65b, the first-2 intermediary connector 65c, and the first-2 connector 65d are disposed to be spaced apart from one another in the lateral direction. In addition, the first-1 intermediary connector 53b, the first-2 intermediary connector 53c, and the first-2 connector 53d may be spaced apart from the light generation region of the first LED stack 20 in the lateral direction and may not be overlapped with the light generation region of the first LED stack 20.

The first-1 connector 65a and the first-2 connector 65d are electrically connected to the first conductivity type semiconductor layer 21 and the second conductivity type semiconductor layer 25 in the light generation region, respectively. For example, the first-1 connector 65a may be electrically connected to the first ohmic electrode 21n through the opening 63e, and the first-2 connector 65d may be electrically connected to the first transparent electrode 25p through the opening 63d.

Further, the first-1 connector 65a may be electrically connected to the second-1 connector 55a through the through hole 20h1 and the opening 63a, the first-1 intermediary connector 65b may be electrically connected to the second intermediary connector 55b through the through hole 20h2 and the opening 63b, and the first-2 intermediary connector 65c may be electrically connected to the second-2 connector 55c through the through hole 20h3 and the opening 63c.

The protection insulation layer 73 covers the first-1 connector 65a, the first-1 intermediary connector 65b, the first-2 intermediary connector 65c, and the first-2 connector 65d. The protection insulation layer 73 may also cover side surfaces of the first LED stack 20. The protection insulation layer includes openings 73a, 73b, 73c, and 73d exposing the first-1 connector 65a, the first-1 intermediary connector 65b, the first-2 intermediary connector 65c, and the first-2 connector 65d, respectively. The openings 73a, 73b, 73c, and 73d are located on the peripheral region of the first LED stack 20.

The bump pads 75a, 75b, 75c, and 75d may be electrically connected to the first-1 connector 65a, the first-1 intermediary connector 65b, the first-2 intermediary connector 65c, and the first-2 connector 65d through the openings 73a, 73b, 73c, and 73d, respectively. The bump pads 75a, 75b, 75c, and 75d may be disposed in the openings 73a, 73b, 73c, and 73d, respectively, but the inventive concepts are not necessarily limited thereto.

The first bump pad 75a may be disposed on the first-1 connector 65a, and may be electrically connected to the first-1 connector 65a, the second-1 connector 55a, and the third-1 connector 49a. As such, the bump pad 75a may be commonly electrically connected to the first conductivity type semiconductor layer 21 of the first LED stack 20, the first conductivity type semiconductor layer 31 of the second LED stack 30, and the first conductivity type semiconductor layer 41 of the third LED stack 40.

The second bump pad 75b may be disposed on the first-1 intermediary connector 65b, and may be electrically connected to the second conductivity type semiconductor layer 45 of the third LED stack 40 through the first-1 intermediary connector 65b, the second intermediary connector 55b, and the third-2 connector 49b.

The third bump pad 75c may be disposed on the first-2 intermediary connector 65c, and may be electrically connected to the second conductivity type semiconductor layer 35 of the second LED stack 30 through the first-2 intermediary connector 65c and the second-2 connector 55c.

The fourth bump pad 75d may be disposed on the first-2 connector 65d, may be electrically connected to the first transparent electrode 25p through the first-2 connector 65d, and, accordingly, may be electrically connected to the second conductivity type semiconductor layer 25 of the first LED stack 20.

That is, the first LED stack 20 is electrically connected between the first bump pad 75a and the fourth bump pad 75d, the second LED stack 30 is electrically connected between the first bump pad 75a and the third bump pad 75c, and the third LED stack 40 is electrically connected between the first bump pad 75a and the second bump pad 75b. As such, the first, second, and third LED stacks 20, 30, and 40 may be independently driven.

Since all of the bump pads 75a, 75b, 75c, and 75d are disposed on the flat first LED stack 20, all of the bump pads 75a, 75b, 75c, and 75d may be located at an identical elevation. Moreover, as shown in FIG. 3C, since the bump pads 75a, 75b, 75c, and 75d may be limitedly disposed on the peripheral region of the first LED stack 20, the bump pads 75a, 75b, 75c, and 75d may be easily formed, and further, stability thereof may be improved. The bump pads 75a, 75b, 75c, and 75d may be disposed to be spaced apart from the light generation regions of the first, second, and third LED stacks 20, 30, and 40 in the lateral direction, and may be disposed near an edge of the light emitting device 100 as shown in FIG. 3C. However, the inventive concepts are not necessarily limited thereto.

The bump pads 75a, 75b, 75c, and 75d may be formed using, for example, Au or Au/In, but the inventive concepts are not limited thereto. Moreover, since the bump pads 75a, 75b, 75c, and 75d are disposed on the first LED stack 20, they may be formed relatively thinner than when the bump pads 75a, 75b, 75c, and 75d are disposed on the substrate 11 or the third LED stack 40. Accordingly, selectivity for a process of forming the bump pads 75a, 75b, 75c, and 75d is improved. For example, the bump pads 75a, 75b, 75c, and 75d may be easily formed by electroplating.

Herein, the first conductivity type semiconductor layers 21, 31, and 41 may be n-type semiconductor layers, and the second conductivity type semiconductor layers 25, 35, and 45 may be p-type semiconductor layers. Accordingly, the light emitting device 100 has a common n-type structure in which the first conductivity type semiconductor layers 21, 31, and 41 are commonly electrically connected to one another. However, the inventive concepts are not limited thereto. For example, in some exemplary embodiments, the first conductivity type semiconductor layers 21, 31, and 41 of each LED stack may be p-type, and the second conductivity type semiconductor layers 25, 35, and 45 may be n-type, and thus, the light emitting device may have a common p-type structure. In addition, in some exemplary embodiments, a stack sequence of each LED stack is not limited to that shown in the drawings and may be variously modified, and thus, the electrical connection structure may be variously modified.

FIGS. 5A, 6A, 7A, 8A, 9A, 10A, 11A, 12A, 13A, 14A, 15A, 16A, and 17A are plan views illustrating a method of manufacturing a light emitting device according to an exemplary embodiment, and FIGS. 5B, 6B, 7B, 8B, 9B, 10B, 11B, 12B, 13B, 14B, 15B, 16B, and 17B are schematic cross-sectional views taken along lines A-A' of FIGS. 5A, 6A, 7A, 8A, 9A, 10A, 11A, 12A, 13A, 14A, 15A, 16A, and 17A, respectively.

Figure 5A:
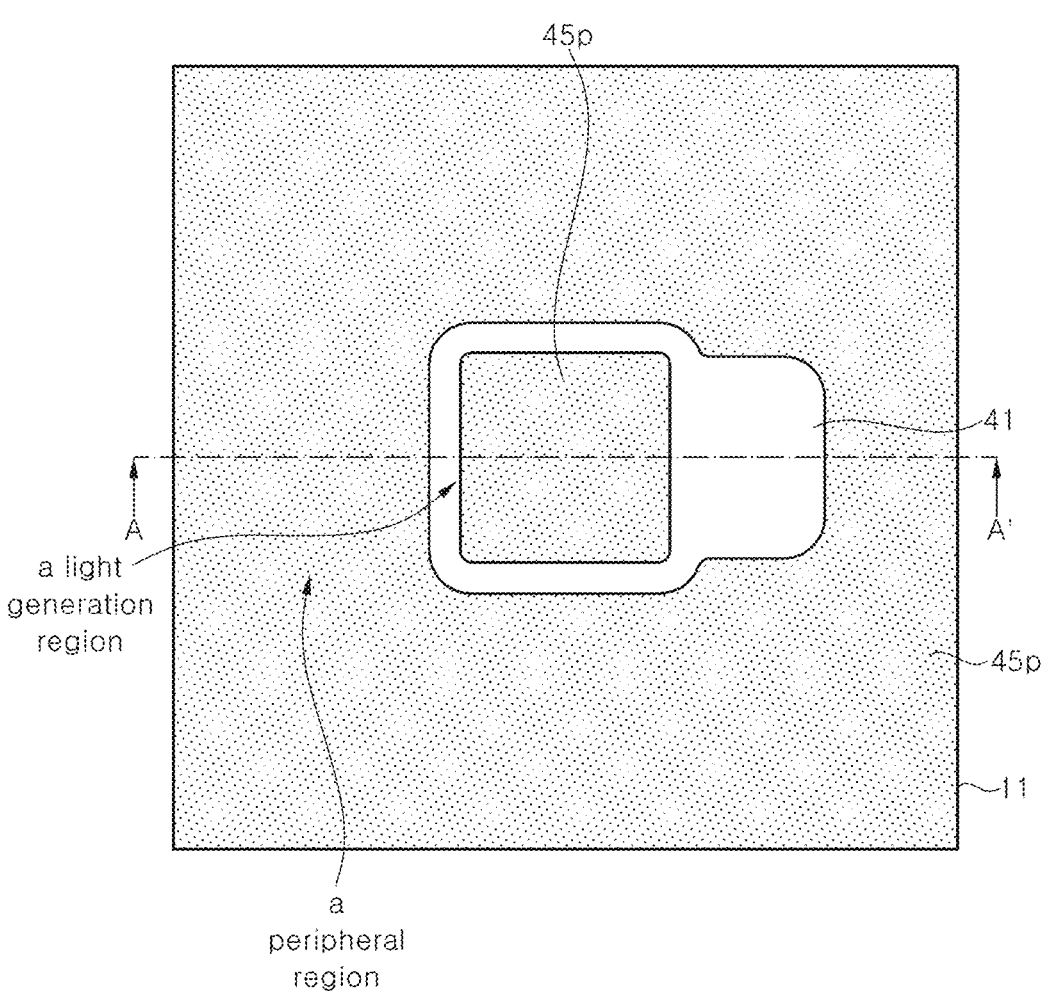
FIGS. 5A, 6A, 7A, 8A, 9A, 10A, 11A, 12A, 13A, 14A, 15A, 16A, and 17A are plan views illustrating a method of manufacturing a light emitting device according to an exemplary embodiment, respectively.
Figure 5B:
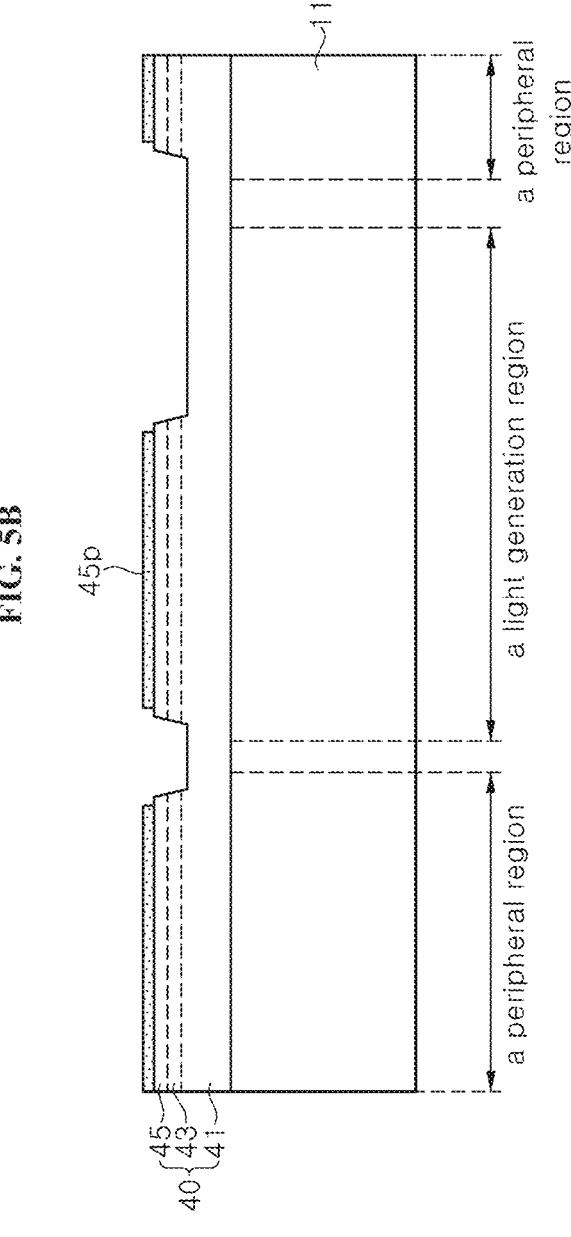

First, referring to FIGS. 5A and 5B, a third LED stack 40 is grown on a substrate 11. The third LED stack 40 may include a first conductivity type semiconductor layer 41, an active layer 43, and a second conductivity type semiconductor layer 45. Subsequently, a third transparent electrode 45p may be formed on the second conductivity type semiconductor layer 45.

The first conductivity type semiconductor layer 41, the active layer 43, and the second conductivity type semiconductor layer 45 of the third LED stack 40 may be sequentially grown on the substrate 11 by, for example, a metal organic chemical vapor deposition (MOCVD) method or a molecular beam epitaxy (MBE) method. The third transparent electrode 45*p* may be formed on the second conductivity type semiconductor layer 45 by, for example, a physical vapor deposition method or a chemical vapor deposition method, and may include a transparent conductive oxide (TCO) such as SnO, InO₂, ZnO, ITO, ITZO, or the like. When the third LED stack 40 emits green light, the substrate 11 may include a sapphire substrate.

Meanwhile, the third transparent electrode 45*p*, the second conductivity type semiconductor layer 45, and the active layer 43 may be patterned, and accordingly, the first conductivity type semiconductor layer 41 may be exposed. For example, a mesa including the second conductivity type semiconductor layer 45 and the active layer 43 may be formed on the first conductivity type semiconductor layer 41, and a light generation region may be defined by the mesa. As shown in FIG. 5A, the light generation region may be surrounded by a peripheral region. The third transparent electrode 45*p* may be disposed on the second conductivity type semiconductor layer 45 on the light generation region, and may also be disposed on the peripheral region.

Figure 6A:
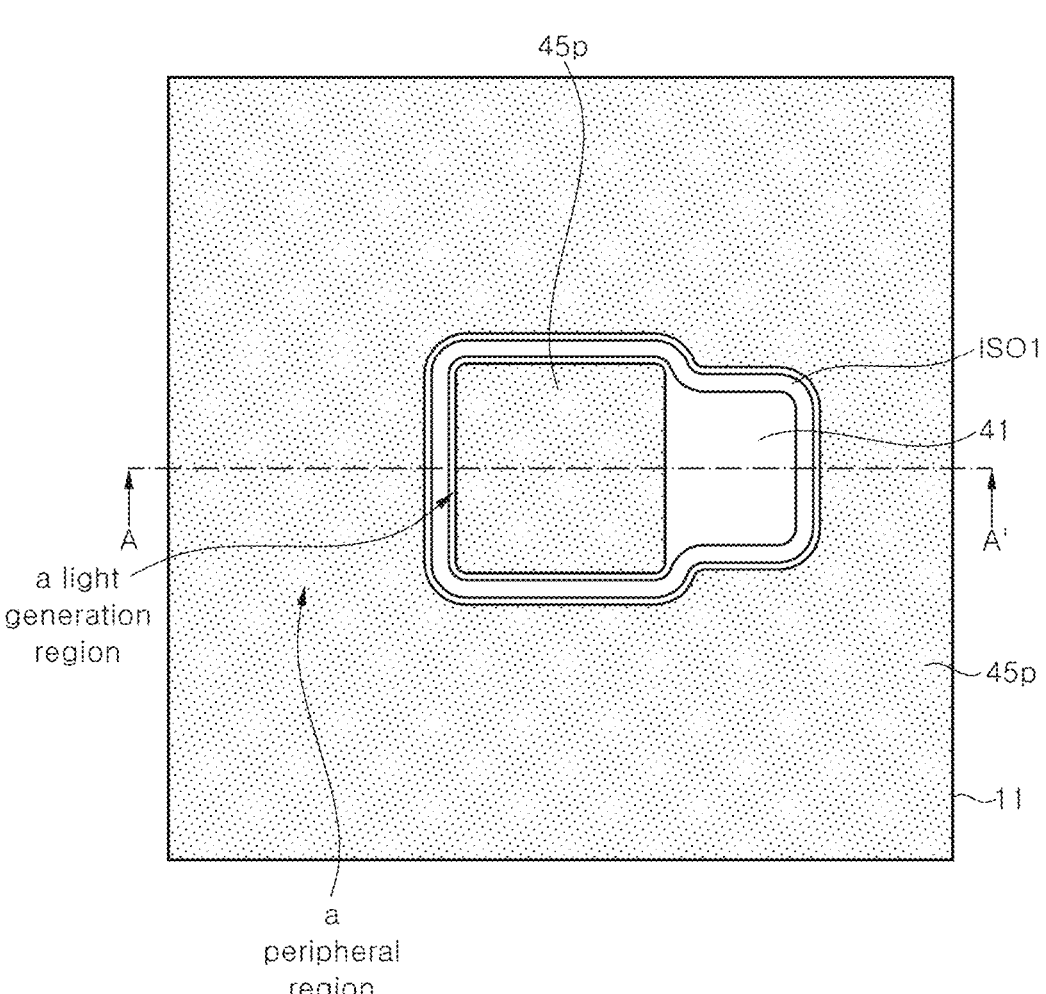
Figure 6B:
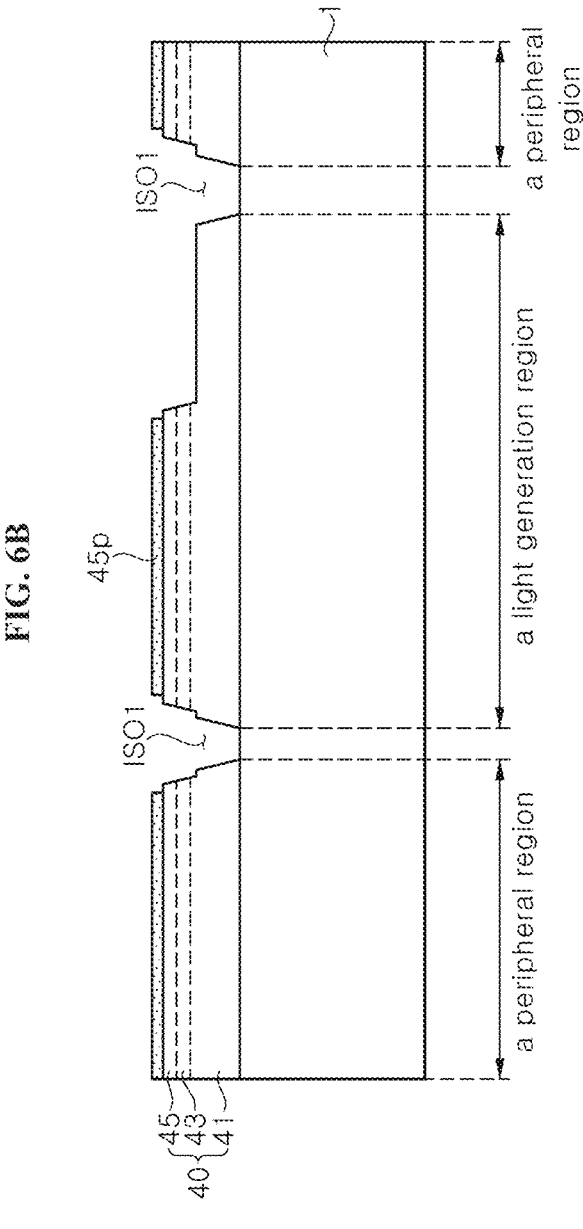

Referring to FIGS. 6A and 6B, an isolation region ISO1 may be formed by removing the exposed first conductivity type semiconductor layer 41 along a periphery of the light generation region. The peripheral region may be separated from the light generation region by the isolation region ISO1. The isolation region may be formed using, for example, photolithography and etching techniques. The substrate 11 may be exposed by the isolation region.

A side surface of the peripheral region surrounding the light generation region may be inclined with respect to a vertical surface as shown in FIG. 6B. The isolation region ISO1 is formed between the light generation region and the peripheral region, but another isolation region may also be formed between adjacent light emitting device regions. In this case, an outer side surface of the peripheral region may also be inclined with respect to the vertical surface.

Figure 7A:
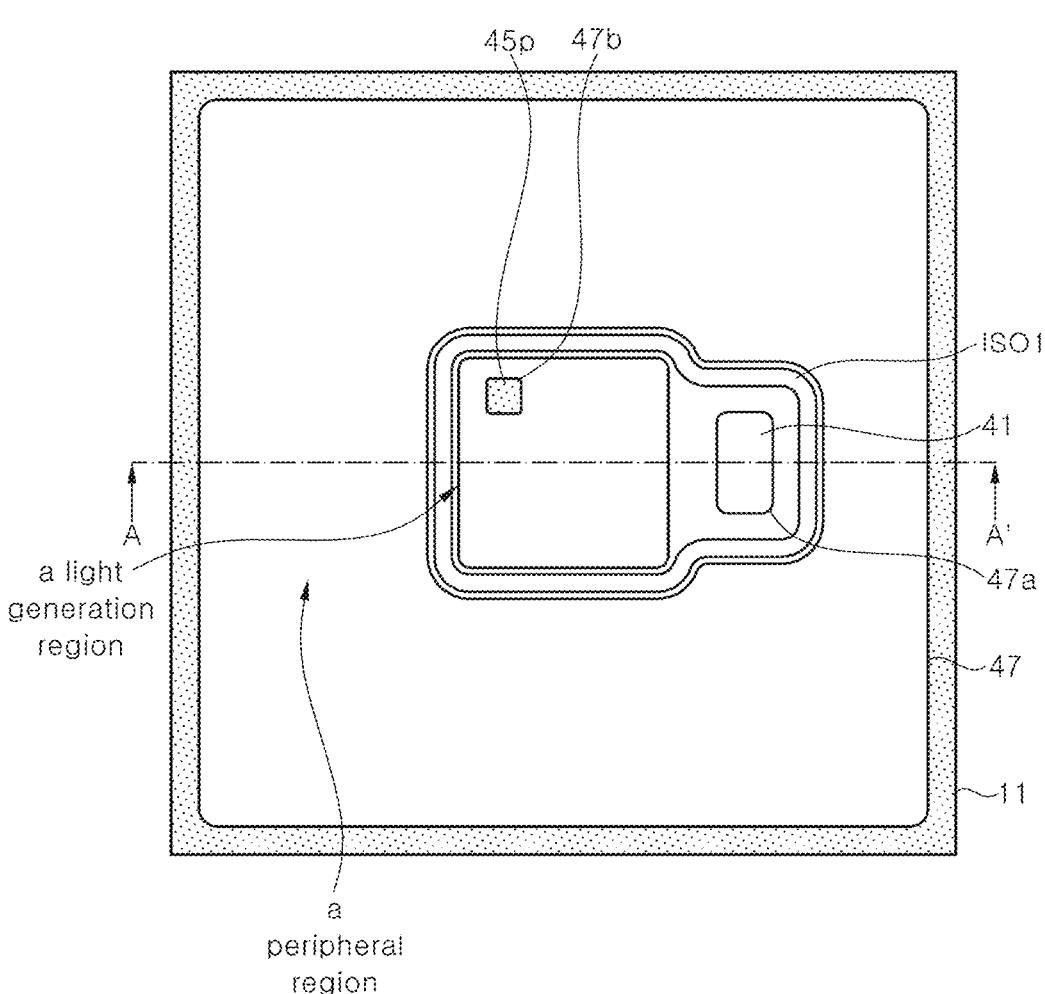
Figure 7B:
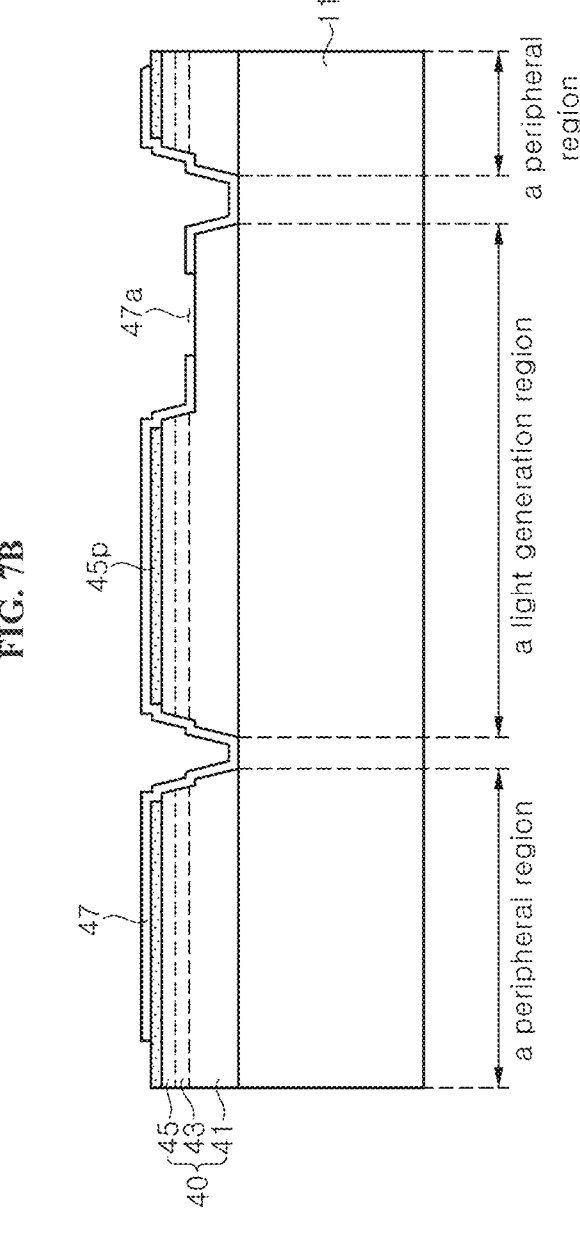

Referring to FIGS. 7A and 7B, a first insulation layer 47 covering the third LED stack 40 and the third transparent electrode 45*p* is formed. The first insulation layer 47 may cover the light generation region and the peripheral region, and may also cover the isolation region ISO1.

However, the first insulation layer 47 may have an opening 47*a* exposing the first conductivity type semiconductor layer 41 and an opening 47*b* exposing the third transparent electrode 45*p*. Furthermore, the first insulation layer 47 may expose an edge of the light emitting device region.

Figure 8A:
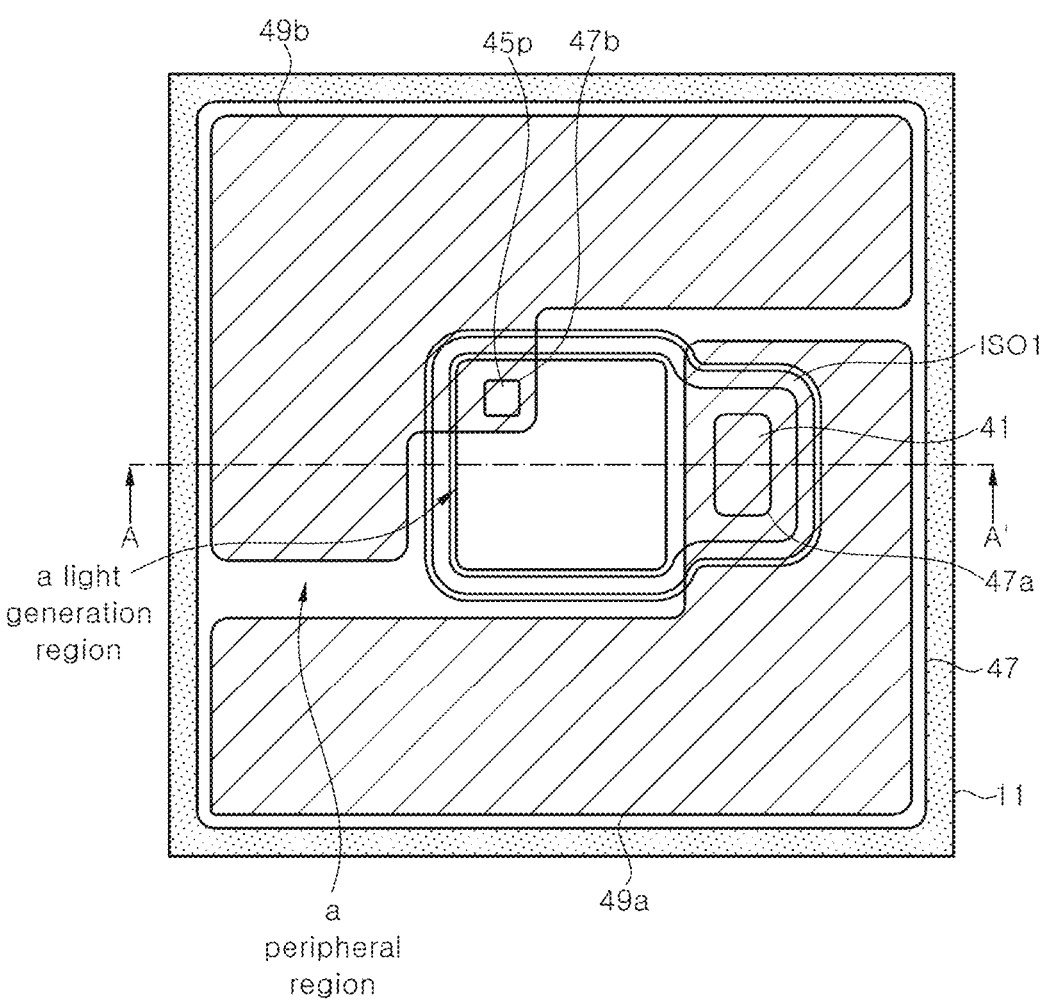
Figure 8B:
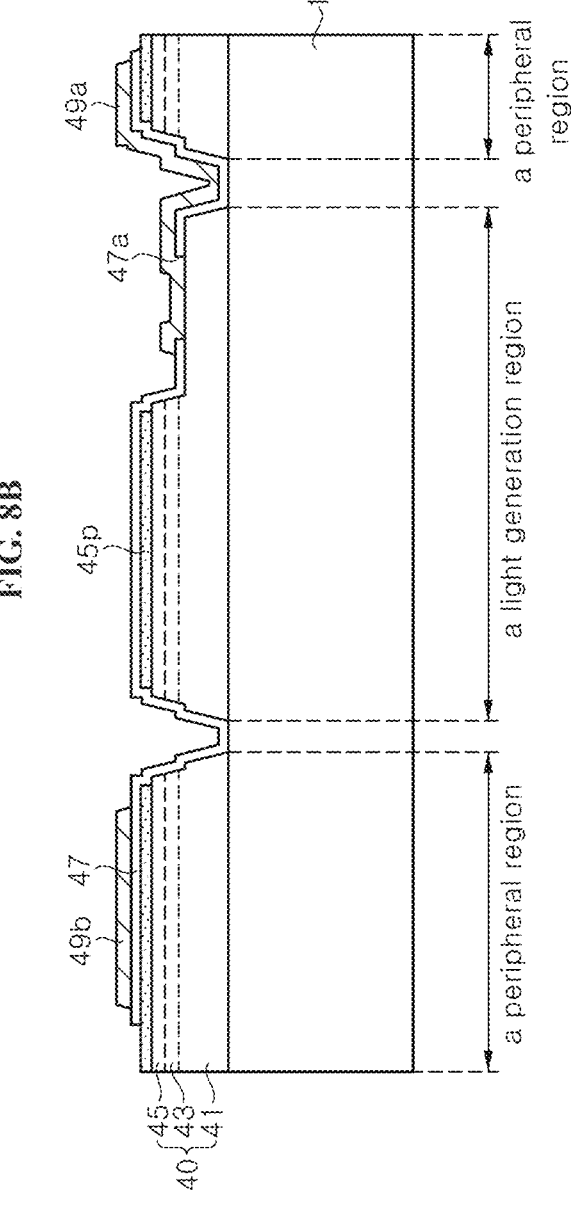

Referring to FIGS. 8A and 8B, a third-1 connector 49*a* and a third-2 connector 49*b* may be formed on the first insulation layer 47. The third-1 connector 49*a* is electrically connected to the first conductivity type semiconductor layer 41 through the opening 47*a*. The third-1 connector 49*a* may extend to the peripheral region across the isolation region ISO1. The third-2 connector 49*b* may be electrically connected to the third transparent electrode 45*p* through the opening 47*b*. The third-2 connector 49*b* may extend to the peripheral region across the isolation region ISO1. The third-1 connector 49*a* and the third-2 connector 49*b* may be formed together of an identical material through an identical process, and may be spaced apart from each other in the lateral direction.

Figure 9A:
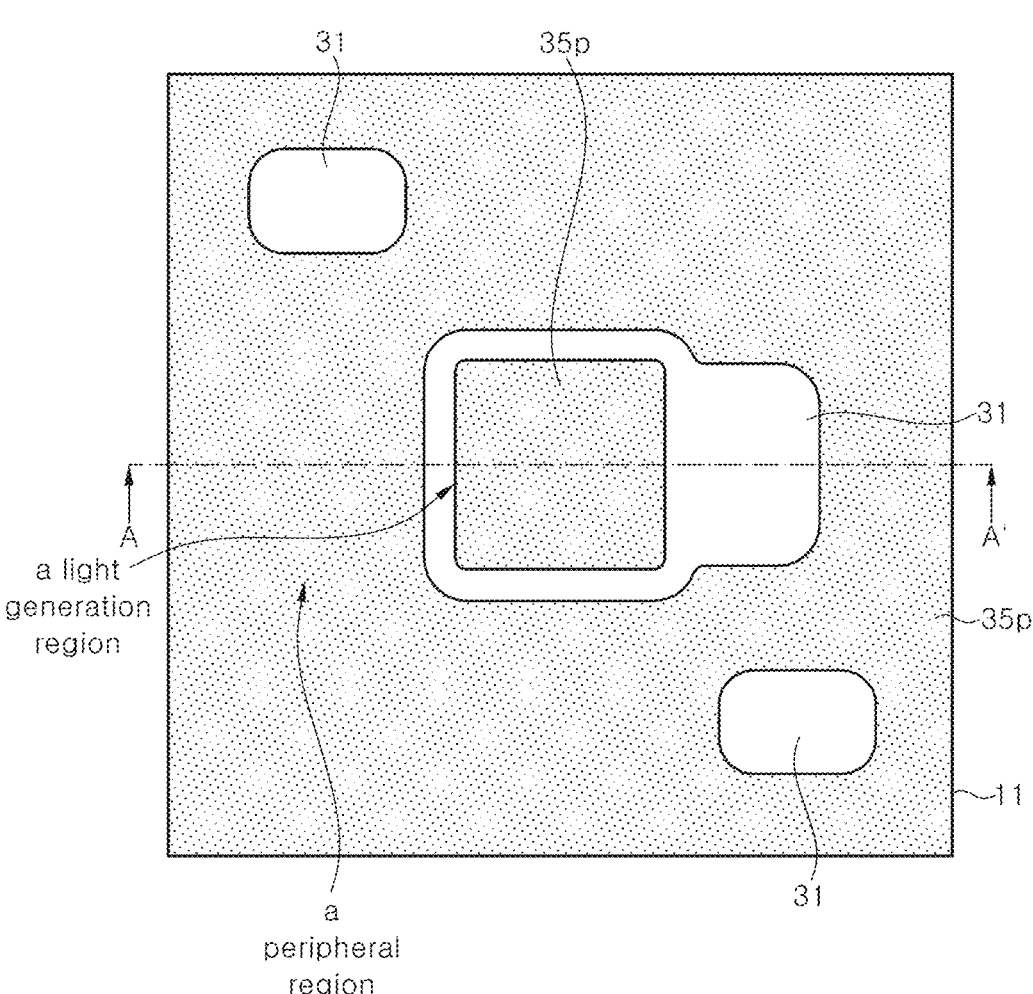
Figure 9B:
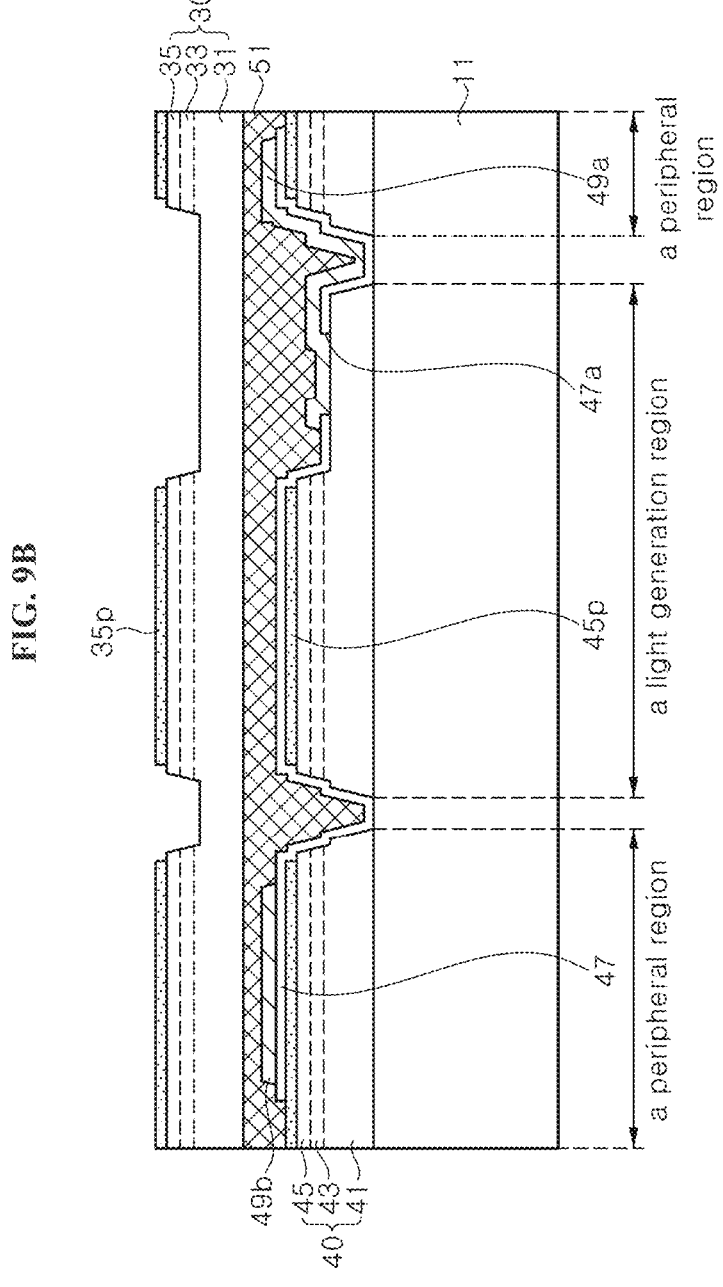

Referring to FIGS. 9A and 9B, a second LED stack 30 is attached on the third LED stack 40 using a first adhesive 51. The second LED stack 30 may be grown on a growth substrate in a similar manner for the third LED stack 40, and may include a first conductivity type semiconductor layer 31, an active layer 33, and a second conductivity type semiconductor layer 35. In addition, a second transparent electrode 35*p* may be formed on the second conductivity type semiconductor layer 35.

Thereafter, the second LED stack 30 may be attached to a temporary substrate to be separated from the growth substrate, and may be attached onto the third LED stack 40 using the first adhesive layer 51 using the temporary substrate. Thereafter, the temporary substrate may be removed, and accordingly, the second LED stack 30 may be attached to the third LED stack 40 so that the second transparent electrode 35*p* faces upward. This process is well known as TBDB (Temporary Bonding and Debonding).

Meanwhile, the second transparent electrode 35*p*, the second conductivity type semiconductor layer 35, and the active layer 33 may be patterned, and accordingly, the first conductivity type semiconductor layer 31 may be exposed. For example, a mesa including the second conductivity type semiconductor layer 35 and the active layer 33 may be formed on the first conductivity type semiconductor layer 31, and a light generation region may be defined by the mesa. As shown in FIG. 9A, the light generation region may be surrounded by a peripheral region. The second transparent electrode 35*p* may be disposed on the second conductivity type semiconductor layer 35 on the light generation region, and may also be disposed on the peripheral region.

Meanwhile, the second conductivity type semiconductor layer 35 and the active layer 33 may also be partially removed in the peripheral region to expose the first conductivity type semiconductor layer 31.

Figure 10A:
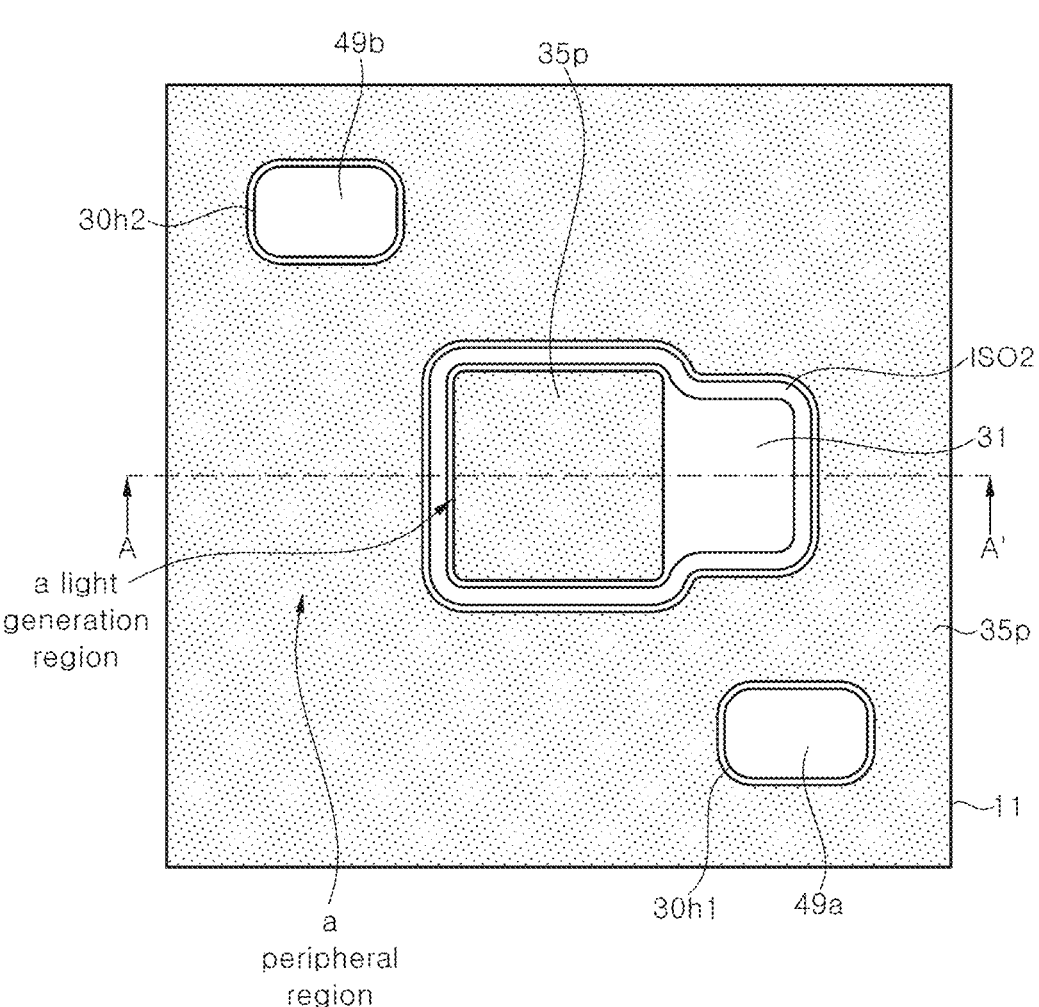
Figure 10B:
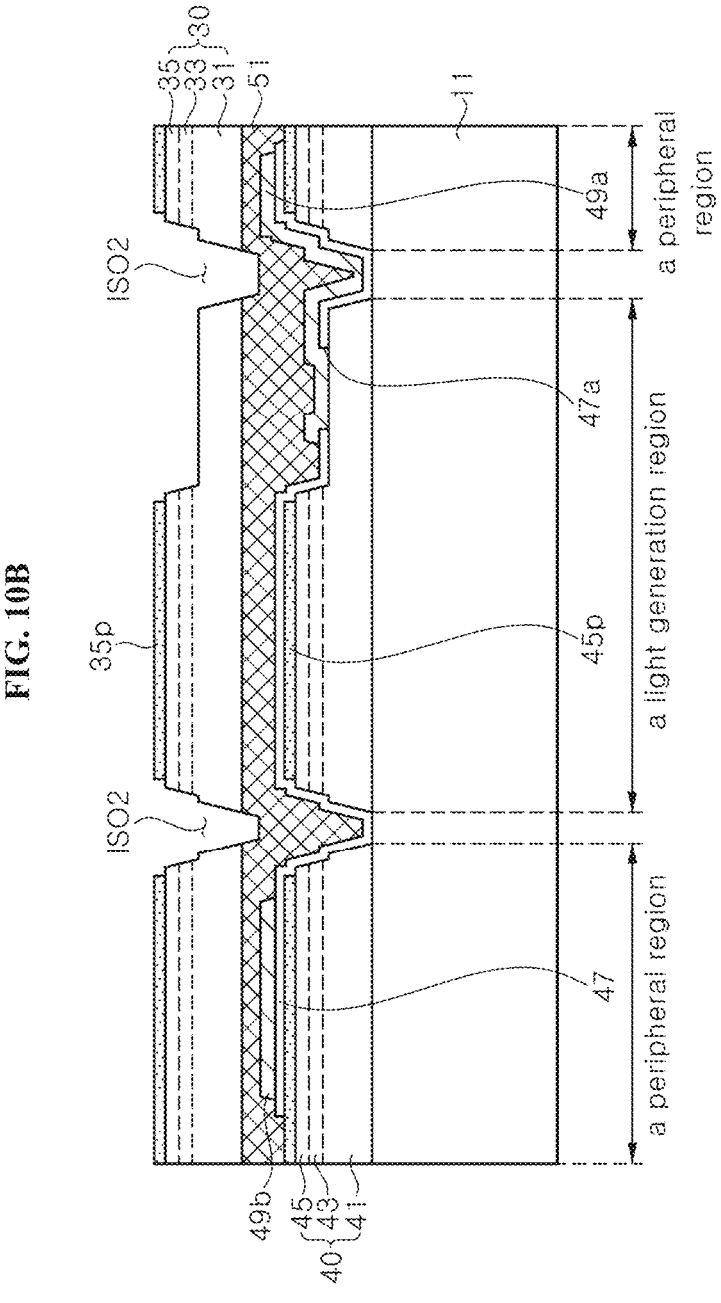

Referring to FIGS. 10A and 10B, an isolation region ISO2 may be formed by removing the exposed first conductivity type semiconductor layer 31 along a periphery of the light generation region. The peripheral region may be separated from the light generation region by the isolation region ISO2. The isolation region may be formed using, for example, photolithography and etching techniques. The first adhesive layer 51 may be exposed by the isolation region, as shown in FIG. 10B.

A side surface of the peripheral region surrounding the light generation region may be inclined with respect to a vertical surface as shown in FIG. 10B. The isolation region ISO2 is formed between the light generation region and the peripheral region, but another isolation region may also be formed between adjacent light emitting device regions. In this case, an outer side surface of the peripheral region may also be inclined with respect to the vertical surface.

Meanwhile, through holes 30*h*1 and 30*h*2 may be formed in the peripheral region of the second LED stack 30. The through holes 30*h*1 and 30*h*2 may be formed through the previously exposed first conductivity type semiconductor layer 31. In another exemplary embodiment, the through holes 30*h*1 and 30*h*2 may be formed by continuously etching away the second conductivity type semiconductor layer 35, the active layer 33, and the first conductivity type semiconductor layer 31. The through holes 30*h*1 and 30*h*2 are also formed to pass through the first adhesive layer 51, thereby exposing the third-1 connector 49*a* and the third-2 connector 49*b*.

Figure 11A:
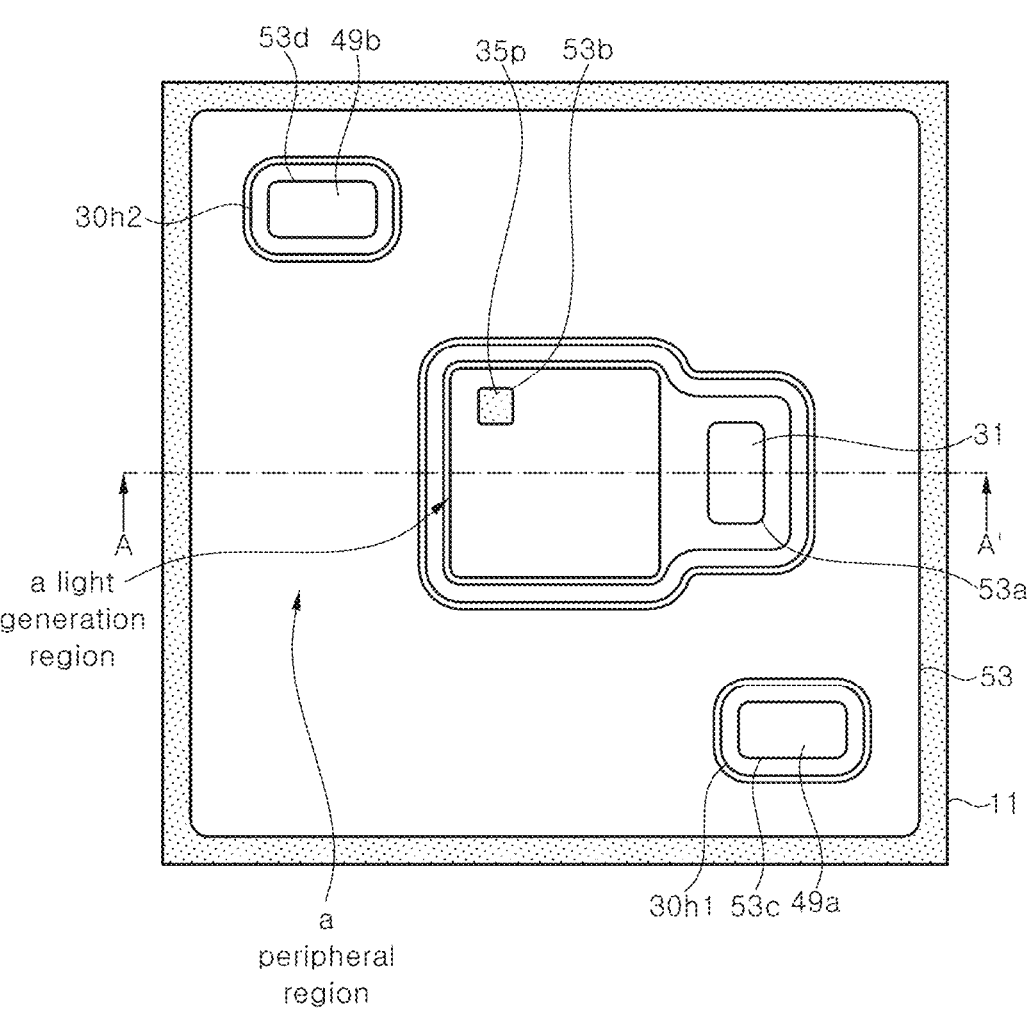
Figure 11B:
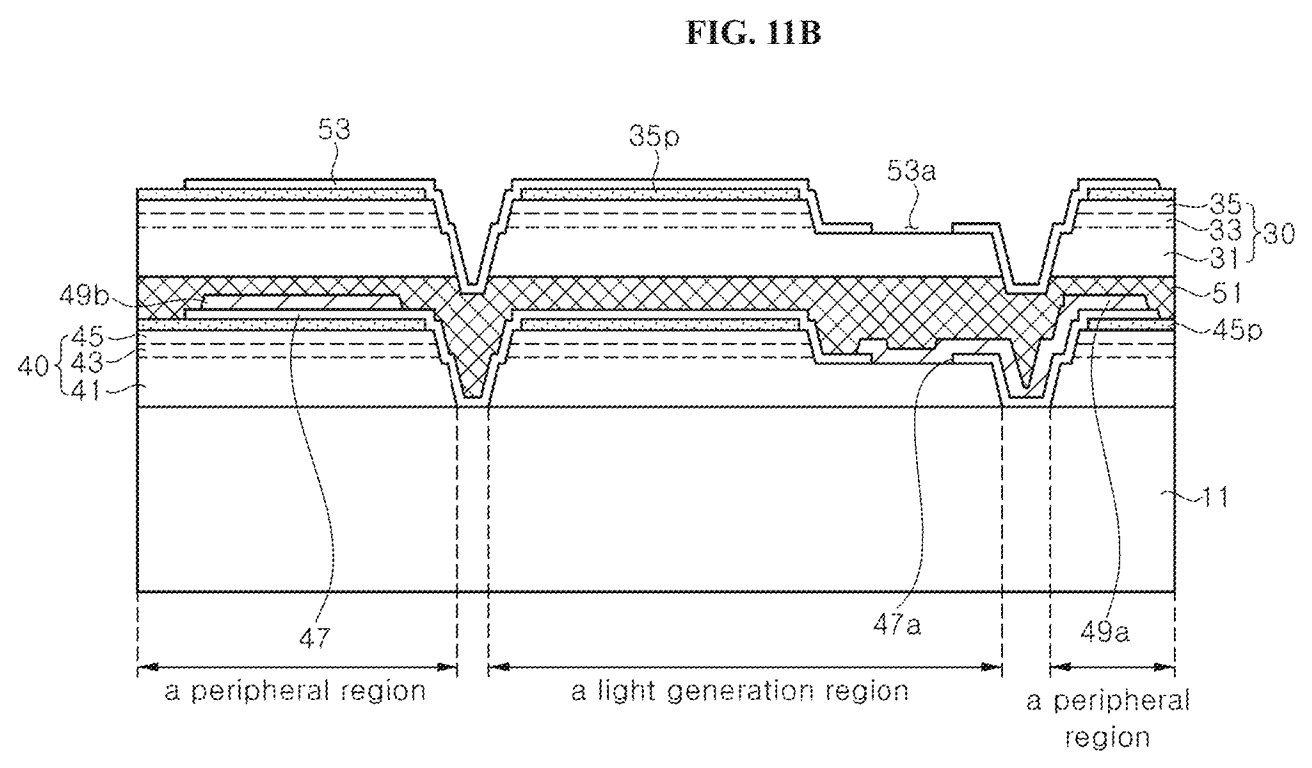

Referring to FIGS. 11A and 11B, a second insulation layer 53 covering the second LED stack 30 and the second transparent electrode 35*p* is formed. The second insulation layer 53 may cover the light generation region and the peripheral region, and may also cover the isolation region ISO2.

However, the second insulation layer 53 may have an opening 53a exposing the first conductivity type semiconductor layer 31 and an opening 53b exposing the second transparent electrode 25p, and may have openings 53c and 53d exposing the third-1 connector 49a and the third-2 connector 49b in the through holes 30h1 and 30h2, respectively. Furthermore, the second insulation layer 53 may expose the edge of the light emitting device region.

Figure 12A:
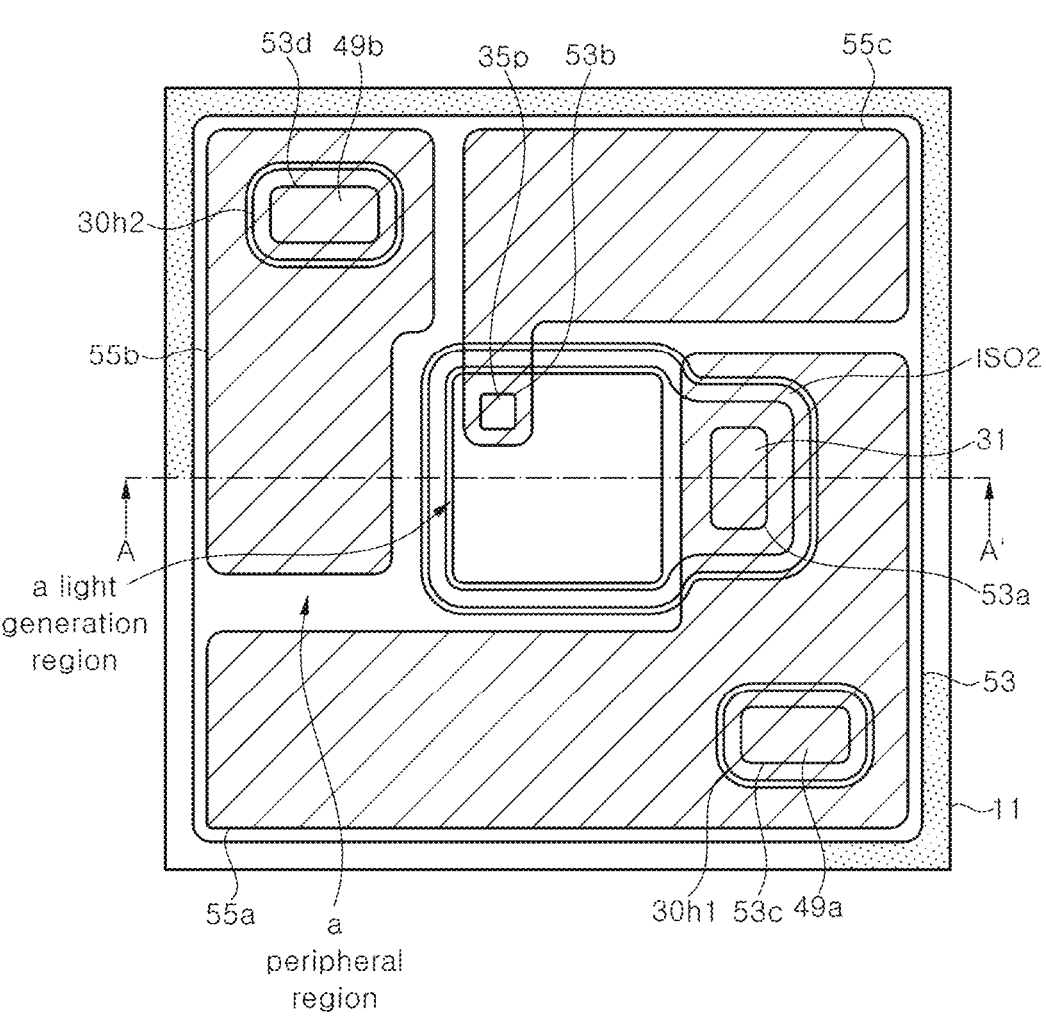
Figure 12B:
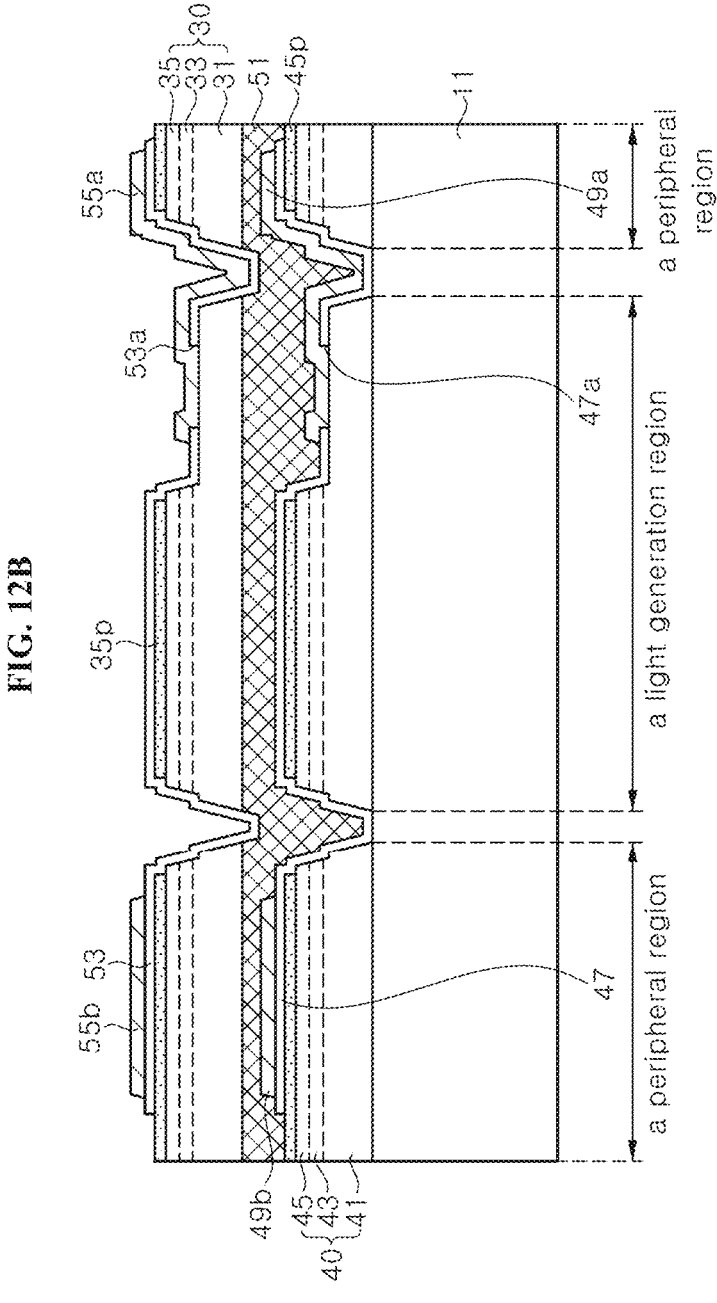

Referring to FIGS. 12A and 12B, a second-1 connector 55a, a second intermediary connector 55b, and a second-2 connector 55c are formed on the second insulation layer 53. In some forms, the second-1 connector 55a, the second intermediary connector 55b, and the second-2 connector 55c may be formed together of an identical material through an identical process, and may be spaced apart from one another in the lateral direction. In other forms, different materials and/or different processes may be used in forming the second-1 connector 55a, the second intermediary connector 55b, and the second-2 connector 55c.

The second-1 connector 55a is electrically connected to the first conductivity type semiconductor layer 31 through the opening 55a. The second-1 connector 55a may extend to the peripheral region across the isolation region ISO2. The second-1 connector 55a may be electrically connected to the third-1 connector 49a through the through hole 30h1 in the peripheral region.

The second-2 connector 55c may be electrically connected to the second transparent electrode 35p through the opening 53b. The second-2 connector 55c may extend to the peripheral region across the isolation region ISO2. In an exemplary embodiment, a region where the second-2 connector 55c is connected to the second transparent electrode 35p may be overlapped with a region where the third-2 connector 49b is connected to the third transparent electrode 45p.

The second intermediary connector 55b may be disposed on the peripheral region of the second LED stack 30, and may be electrically connected to the third-2 connector 49b through the through hole 30h2. The second intermediary connector 55b and the second-1 connector 55a may be disposed to be spaced apart from the light generation region of the second LED stack 30 in the lateral direction.

Figure 13A:
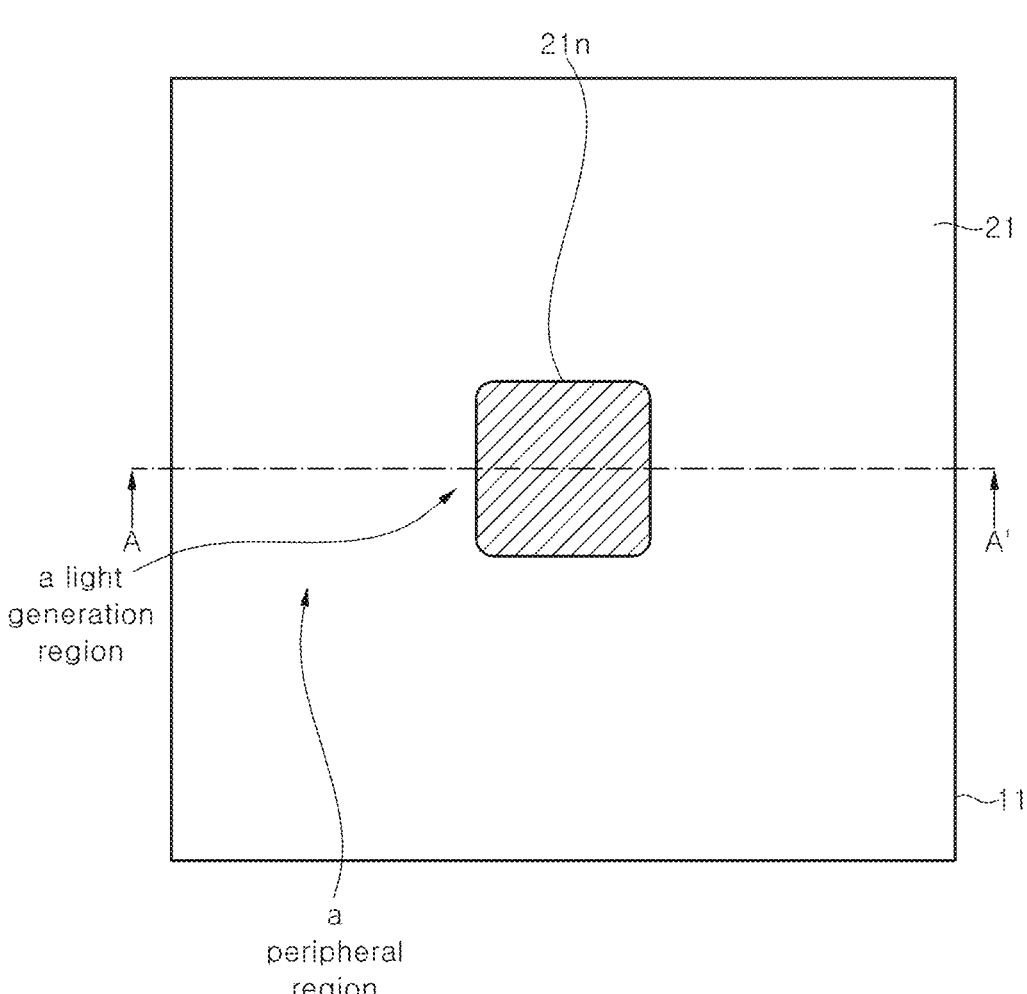
Figure 13B:
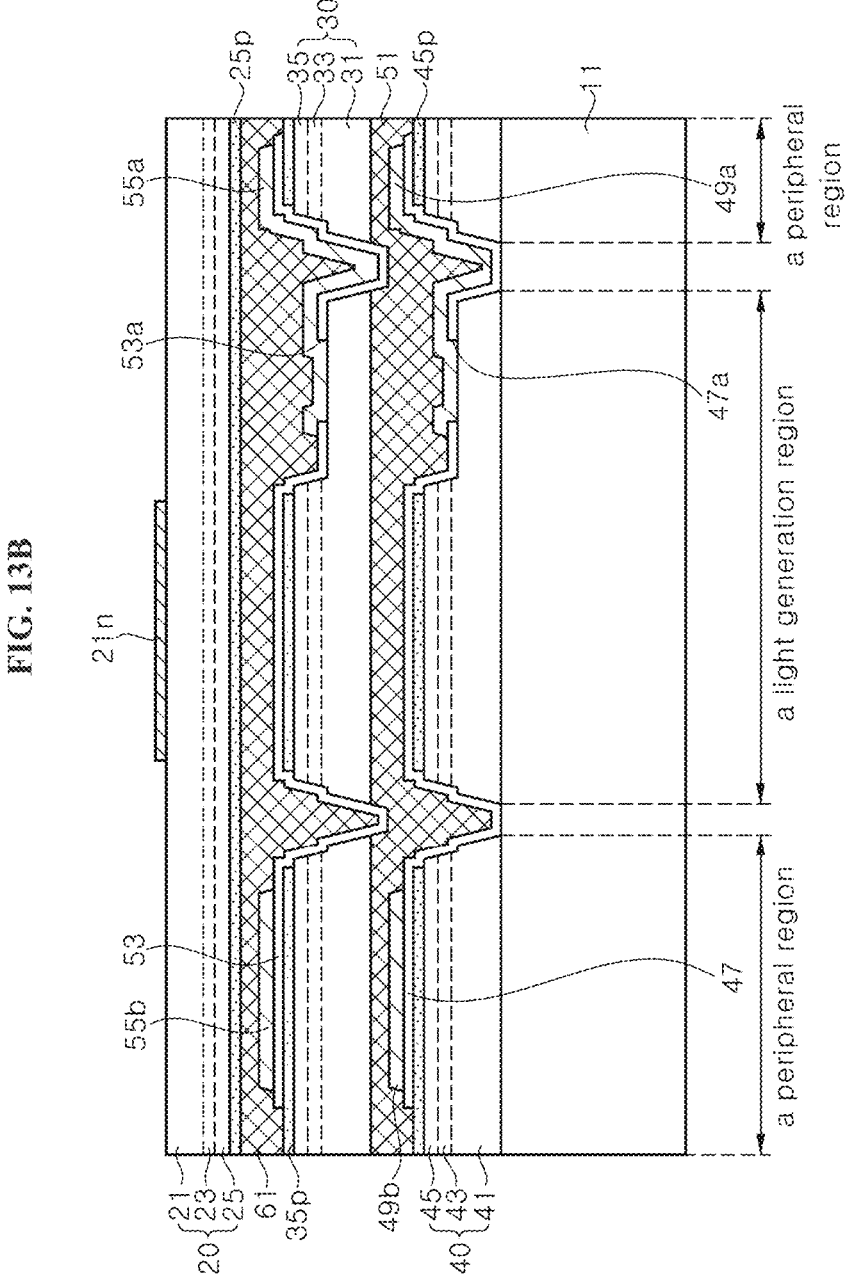

Referring to FIGS. 13A and 13B, the first LED stack 20 may be attached to the second LED stack 30 using the second adhesive layer 61. The first LED stack 20 may be grown on a growth substrate, and a first transparent electrode 25p may be formed on the grown first LED stack 20. Thereafter, the growth substrate may be removed after the first LED stack 20 is attached to the second LED stack 30 by the second adhesive layer 61. Accordingly, the first LED stack 20 may be attached onto the third LED stack 30 so that a first conductivity type semiconductor layer 21 is disposed on an upper side. That is, the first transparent electrode 25p may be attached to the second adhesive layer 61.

Thereafter, a first ohmic electrode 21n is formed on the first conductivity type semiconductor layer 21. The first ohmic electrode 21n may be formed to be at least partially overlapped with the light generation regions of the second LED stack 30 and the third LED stack 40. The first ohmic electrode 21n may be in ohmic contact with the first conductivity type semiconductor layer 21, and for this purpose, a portion of the first conductivity type semiconductor layer 21 may be removed. For example, a portion of an upper surface of the first conductivity type semiconductor layer 21 of the first LED stack 20 may be patterned through wet etching to form the first ohmic electrode 21n. The first conductivity type semiconductor layer 21 may be, for example, an n++ GaAs layer, and a portion of an upper surface of the n++ GaAs layer may be recessed through wet etching. The first ohmic electrode 21n may be formed in a recessed region of the first conductivity type semiconductor layer 21.

The first ohmic electrode 21n may be formed of, for example, AuGe/Ni/Au/Ti, and may be formed to have a thickness of (100 nm/25 nm/100 nm/10 nm), for example.

Figure 14A:
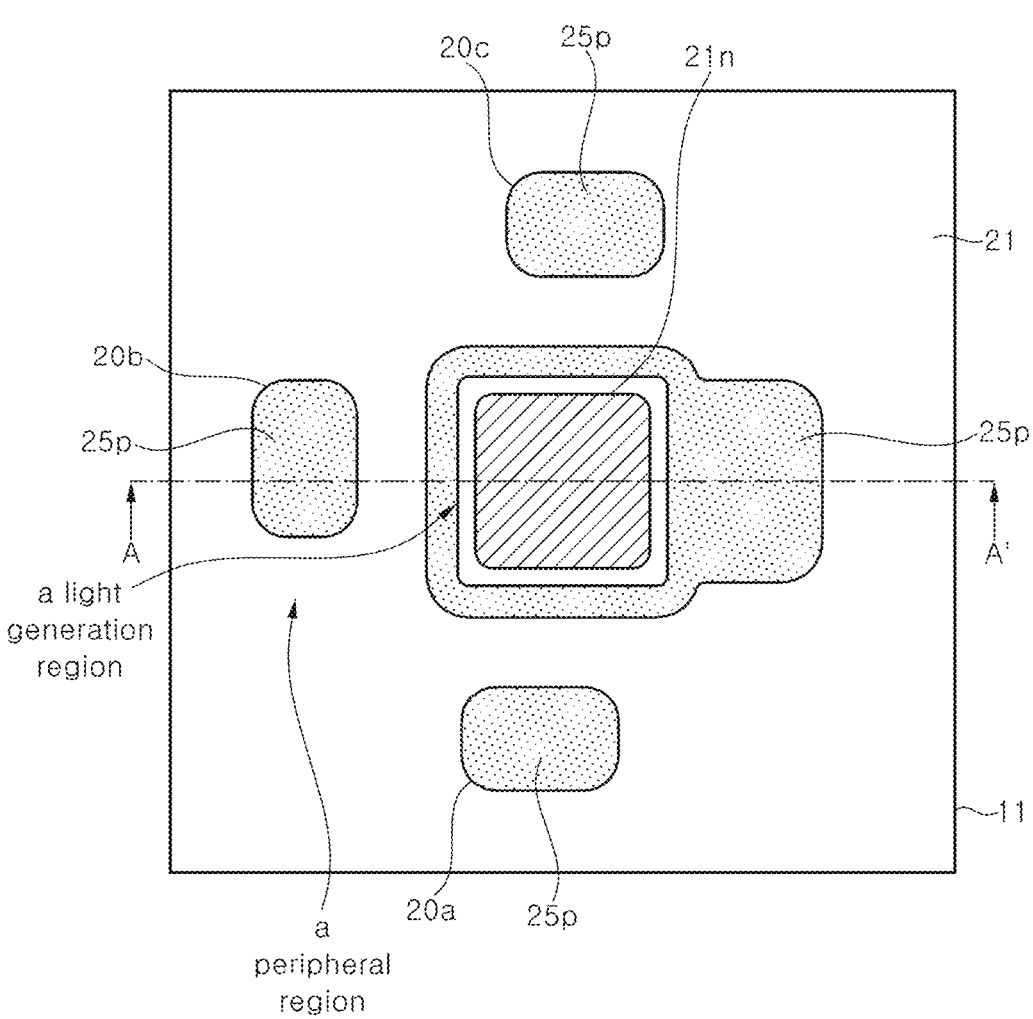
Figure 14B:
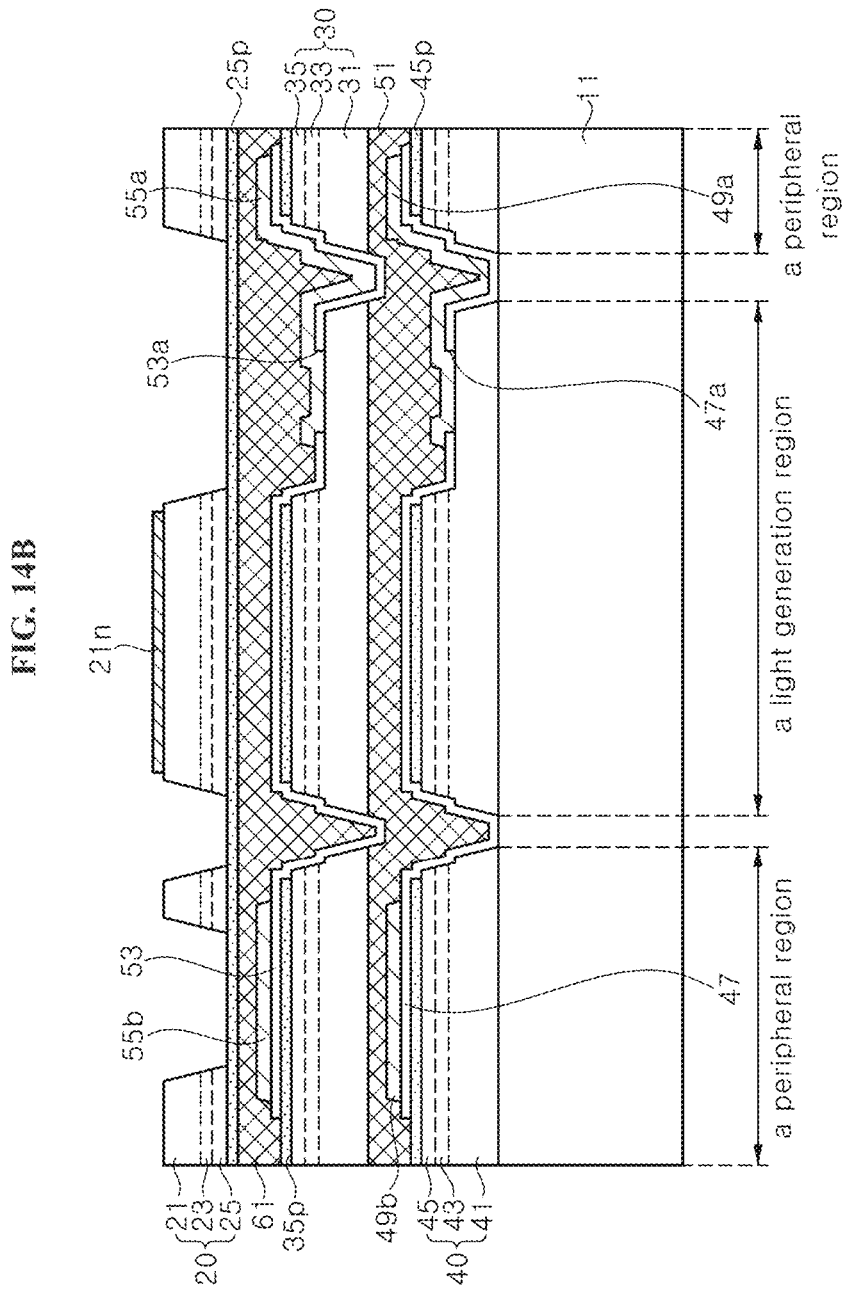

Referring to FIGS. 14A and 14B, the first conductivity type semiconductor layer 21, an active layer 23, and a second conductivity type semiconductor layer 25 are patterned to expose the first transparent electrode 25p. A light generation region is formed under the first ohmic electrode 21n, and a peripheral region may surround the light generation region. In addition, the first transparent electrode 25p may be exposed between the light generation region and the peripheral region. Furthermore, through regions exposing the first transparent electrode 25p may be formed in the peripheral region as well.

Figure 15A:
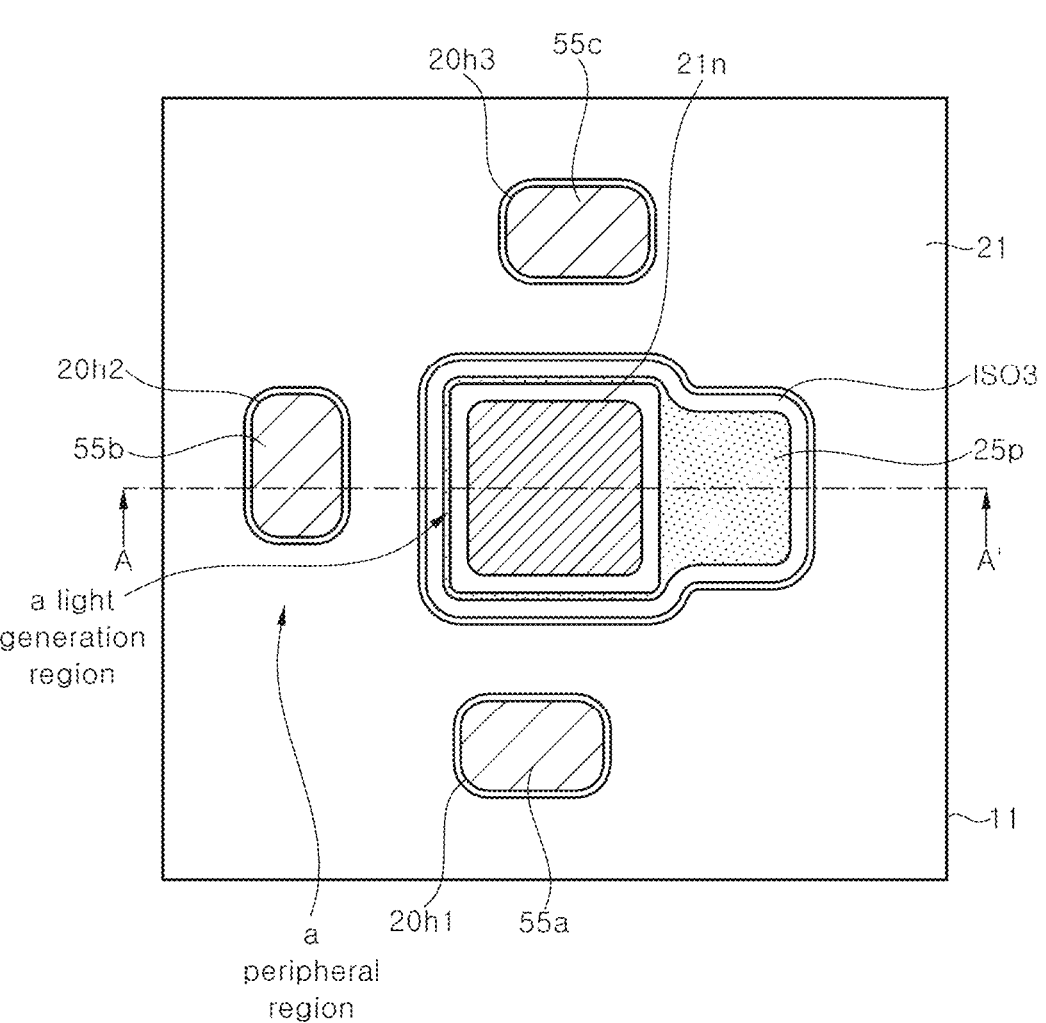
Figure 15B:
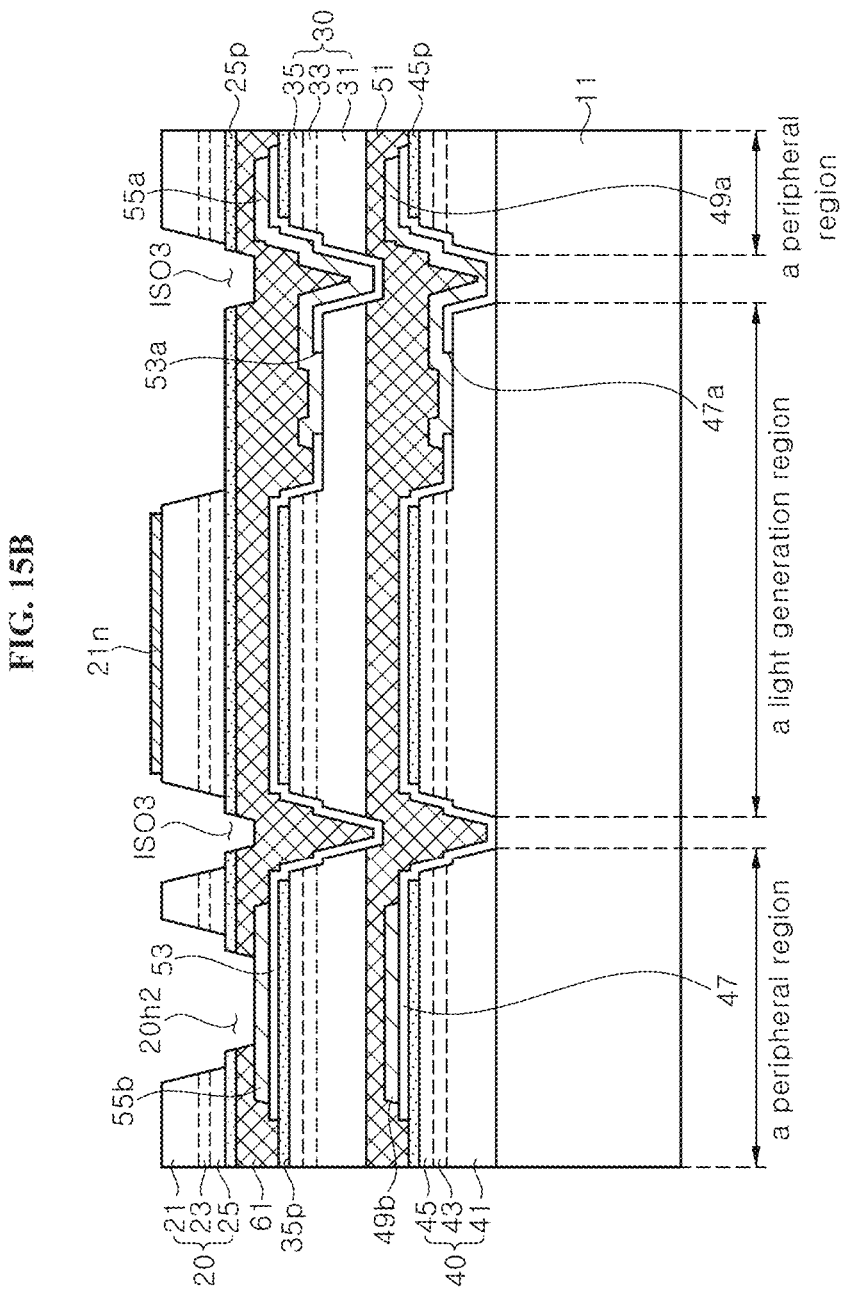

Referring to FIGS. 15A and 15B, an isolation region ISO3 that separates the peripheral region from the light generation region is formed. By etching the first transparent electrode 25p, the first transparent electrode 25p located under the peripheral region may be separated from the first transparent electrode 25p located under the light generation region. Furthermore, while the first transparent electrodes 25p exposed in the peripheral region are removed, through holes 20h1, 20h2, and 20h3 passing through the second adhesive layer 61 may be formed.

The through holes 20h1, 20h2, and 20h3 may pass through the first transparent electrode 25p and the adhesive layer 61 along with the first conductivity type semiconductor layer 21, the active layer 23, and the second conductivity type semiconductor layer 25 to expose the second-1 connector 55a, the second intermediary connector 55b, and the second-2 connector 55c.

Figure 16A:
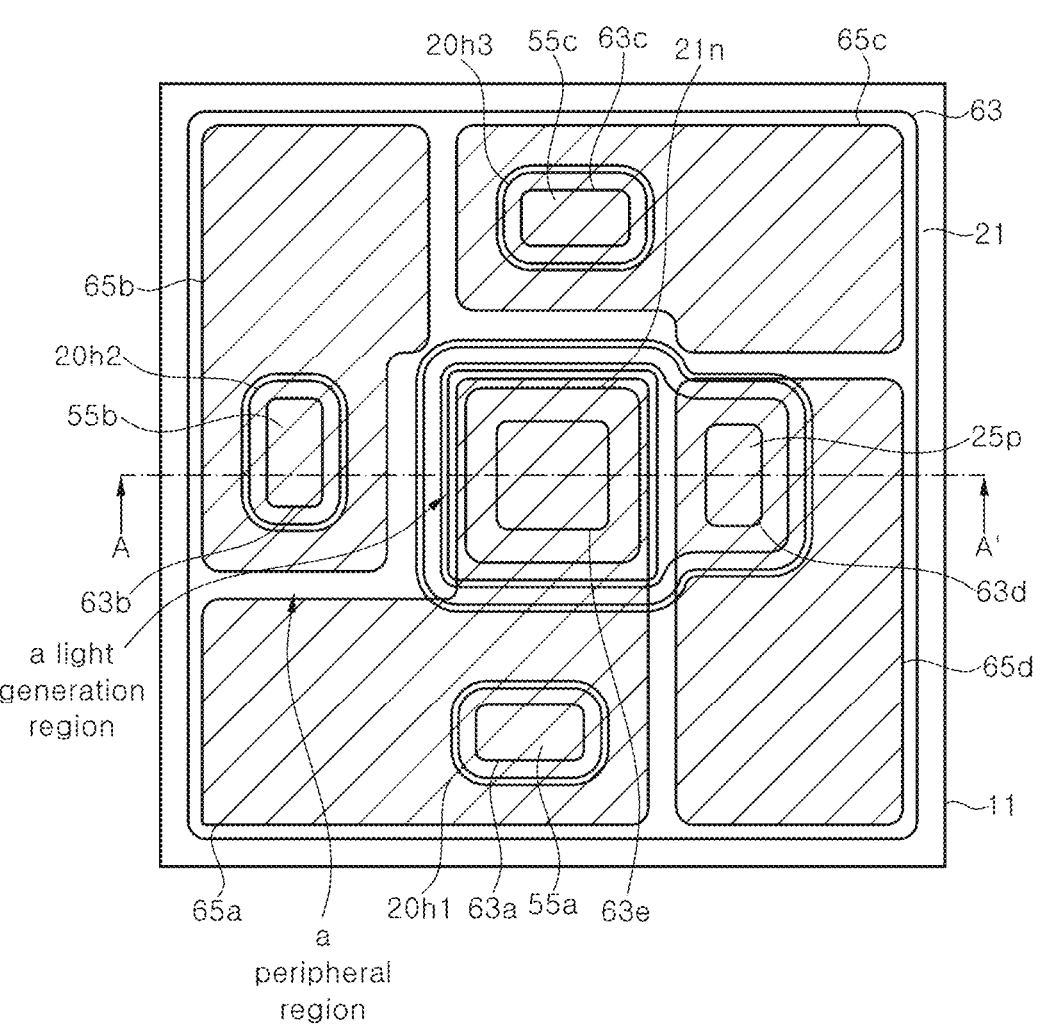
Figure 16B:
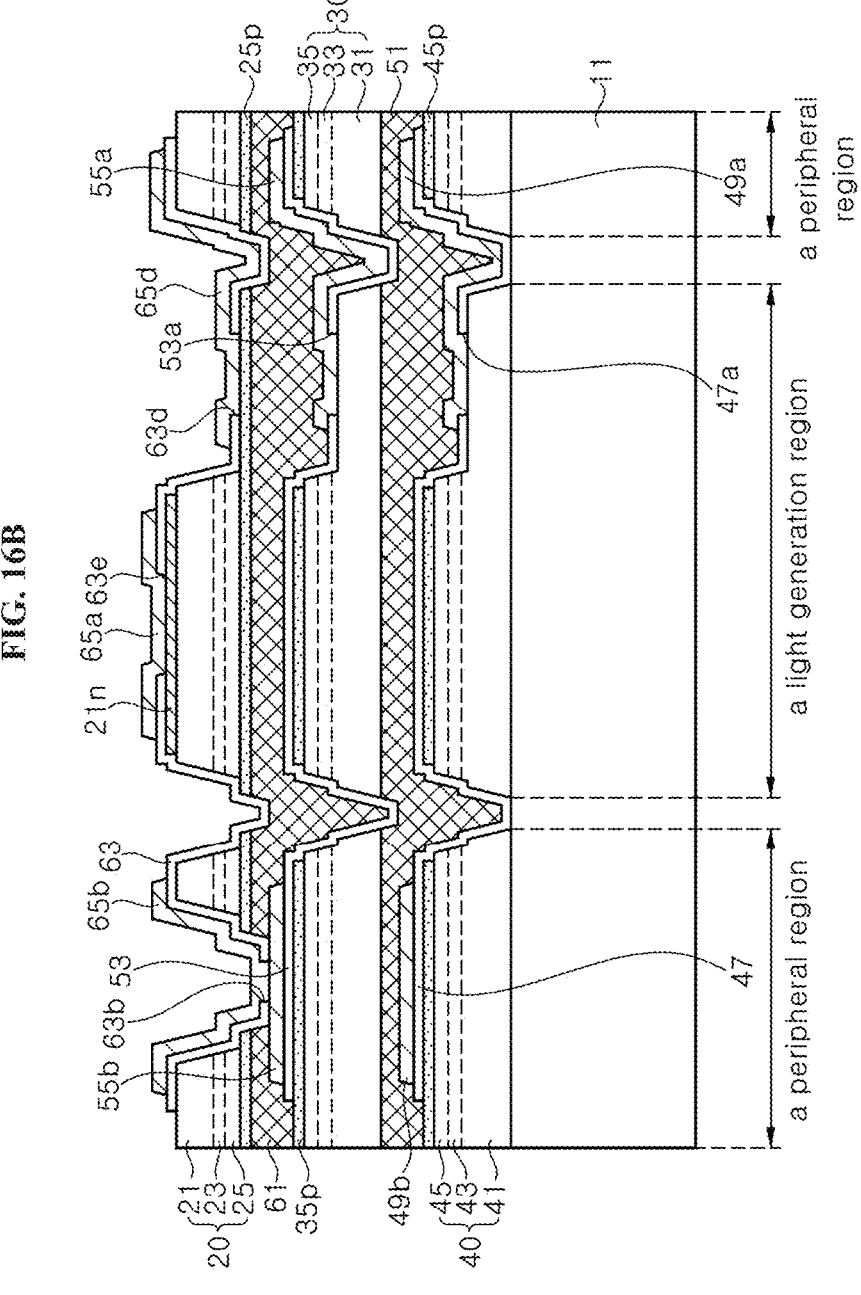

Referring to FIGS. 16A and 16B, a third insulation layer 63 covering the first LED stack 20 and the first ohmic electrode 21n is formed. The third insulation layer 63 may cover the exposed first transparent electrode 25p. Meanwhile, the third insulation layer 63 may have openings 63a, 63b and 63c exposing the second-1 connector 55a, the second intermediary connector 55b, and the second-2 connector 55c in the through holes 20h1, 20h2, and 20h3. Furthermore, the third insulation layer 63 may have an opening 63d exposing the first transparent electrode 25p and an opening 63e exposing the first ohmic electrode 21n near the light generation region. Furthermore, the third insulation layer 63 may expose the first conductivity type semiconductor layer 21 near the edge of the light emitting device.

Meanwhile, a first-1 connector 65a, a first-1 intermediary connector 65b, a first-2 intermediary connector 65c, and a first-2 connector 65d are formed on the third insulation layer 63. In some forms, the first-1 connector 65a, the first-1 intermediary connector 65b, the first-2 intermediary connector 65c, and the first-2 connector 65d may be formed together of an identical material through an identical process, and may be spaced apart from one another in the lateral direction. In other forms, different materials and/or different processes may be used to form the first-1 connector 65a, the first-1 intermediary connector 65b, the first-2 intermediary connector 65c, and the first-2 connector 65d.

As shown in FIG. 16A, the first-1 connector 65a is electrically connected to the first ohmic electrode 21n exposed through the opening 65e. The first-1 connector 65a may also extend from the light generation region to the peripheral region and may be electrically connected to the second-1 connector 55*a* exposed through the through hole 21*h* and the opening 63*a*. The first-1 connector 65*a* may be electrically connected to first conductivity type semiconductor layers 31 and 41 of the second and third LED stacks 30 and 40 through the second-1 connector 55*a* and the third-1 connector 49*a*.

Meanwhile, the first-2 connector 65*d* may be electrically connected to the first transparent electrode 25*p* exposed through the opening 63*d*. The first-2 connector 65*d* may extend to the peripheral region across the isolation area ISO3.

The first-1 intermediary connector 65*b* may be electrically connected to the second intermediary connector 55*b* exposed through the through hole 21*h*2 and the opening 63*b*. As such, the first-1 intermediary connector 65*b* may be electrically connected to the second conductivity type semiconductor layer 45 of the third LED stack 40 through the second intermediary connector 55*b* and the third-2 connector 49*b*.

The first-2 intermediary connector 65*c* may be electrically connected to the second-2 connector 55*c* exposed through the through hole 21*h*3 and the opening 63*c*. The first-2 intermediary connector 65*c* may be electrically connected to the second conductivity type semiconductor layer 35 of the second LED stack 30 through the second-2 connector 55*c*.

Figure 17A:
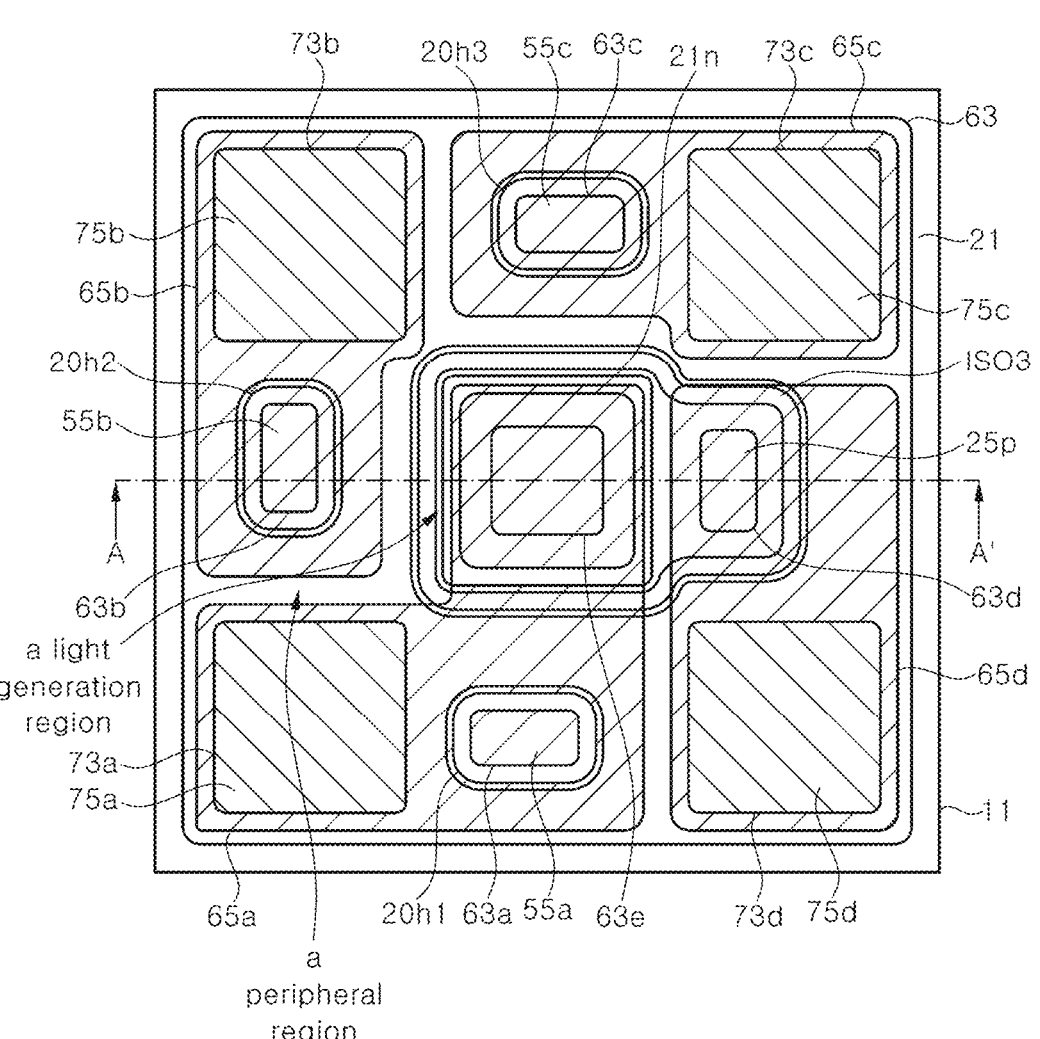
Figure 17B:
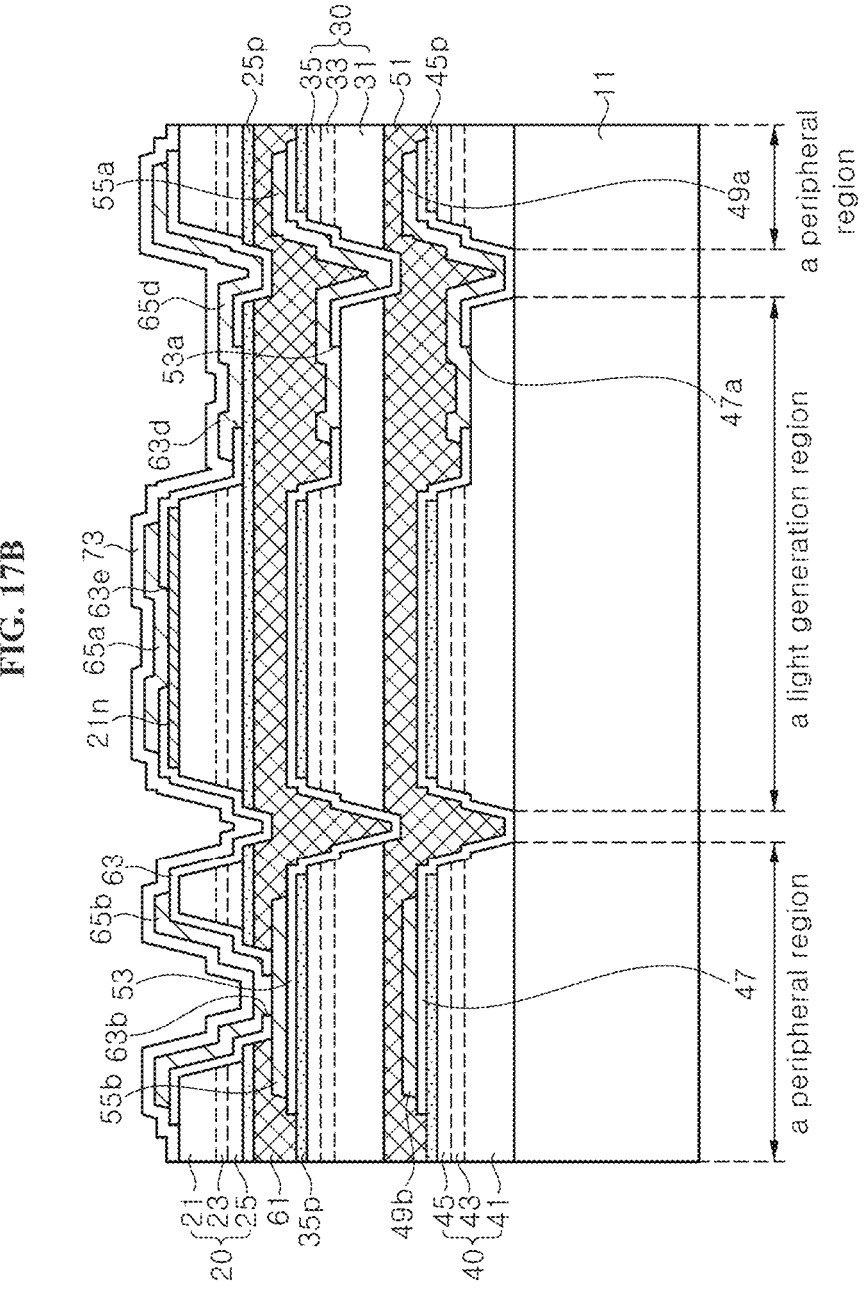

Referring to FIGS. 17A and 17B, a protection insulation layer 73 covering the first-1 connector 65*a*, the first-1 intermediary connector 65*b*, the first-2 intermediary connector 65*c*, and the first-2 connector 65*d* is formed. The protection insulation layer 73 may also cover an edge of the third insulation layer 63, and may cover the first LED stack 20.

The protection insulation layer 73 may have openings 73*a*, 73*b*, 73*c*, and 73*d* exposing the first-1 connector 65*a*, the first-1 intermediary connector 65*b*, the first-2 intermediary connector 65*c*, and the first-2 connector 65*d*. The openings 73*a*, 73*b*, 73*c*, and 73*d* may be spaced apart from the light generation region of the first LED stack 20 in the lateral direction to be located over the peripheral region.

Subsequently, bump pads 75*a*, 75*b*, 75*c*, and 75*d* may be formed in the openings 73*a*, 73*b*, 73*c*, and 73*d* of the protection insulation layer 73. The bump pads 75*a*, 75*b*, 75*c*, and 75*d* may be formed using a lift-off technique using a photoresist pattern for forming the openings 73*a*, 73*b*, 73*c*, and 73*d* of the protection insulation layer 73. The bump pads 75*a*, 75*b*, 75*c*, and 75*d* may be formed using, for example, an electroplating technique. The bump pads 75*a*, 75*b*, 75*c*, and 75*d* may be formed near the edge of the light emitting device region.

Thereafter, a light emitting device 100 may be completed by cutting the first, second, and third LED stacks 20, 30, and 40 and the substrate 11 using a laser. In another exemplary embodiment, the first, second, and third LED stacks 20, 30, and 40 may be pre-separated for each light emitting device region during the process. In this case, the light emitting device 100 may be completed by cutting the first and second adhesive layers 51 and 61 and the substrate 11 after the bump pads 75*a*, 75*b*, 75*c*, and 75*d* are formed.

In the illustrated exemplary embodiment, each of the first, second, and third LED stacks 20, 30, and 40 has the light generation region and the peripheral region. The peripheral region may surround the light generation region. Further, the first conductivity type semiconductor layers 21, 31, and 41, the active layers 23, 33, and 43, and the second conductivity type semiconductor layers 25, 35, and 45 in the peripheral regions may be separated from the first conductivity type semiconductor layers 21, 31, and 41, the active layers 23, 33, and 43, and the second conductivity type semiconductor layers 25, 35, and 45 in the light generation region.

According to the illustrated exemplary embodiment, the bump pads 75*a*, 75*b*, 75*c*, and 75*d* are formed on the peripheral region of the first LED stack 20. Since the bump pads 75*a*, 75*b*, 75*c*, and 75*d* do not need to extend to the second LED stack 30, the third LED stack 40, or the substrate 11, they may be formed to have a relatively thin thickness. As such, the bump pads 75*a*, 75*b*, 75*c*, and 75*d* may be easily formed, and stability of the bump pads 75*a*, 75*b*, 75*c*, and 75*d* may be improved.

Figure 18A:
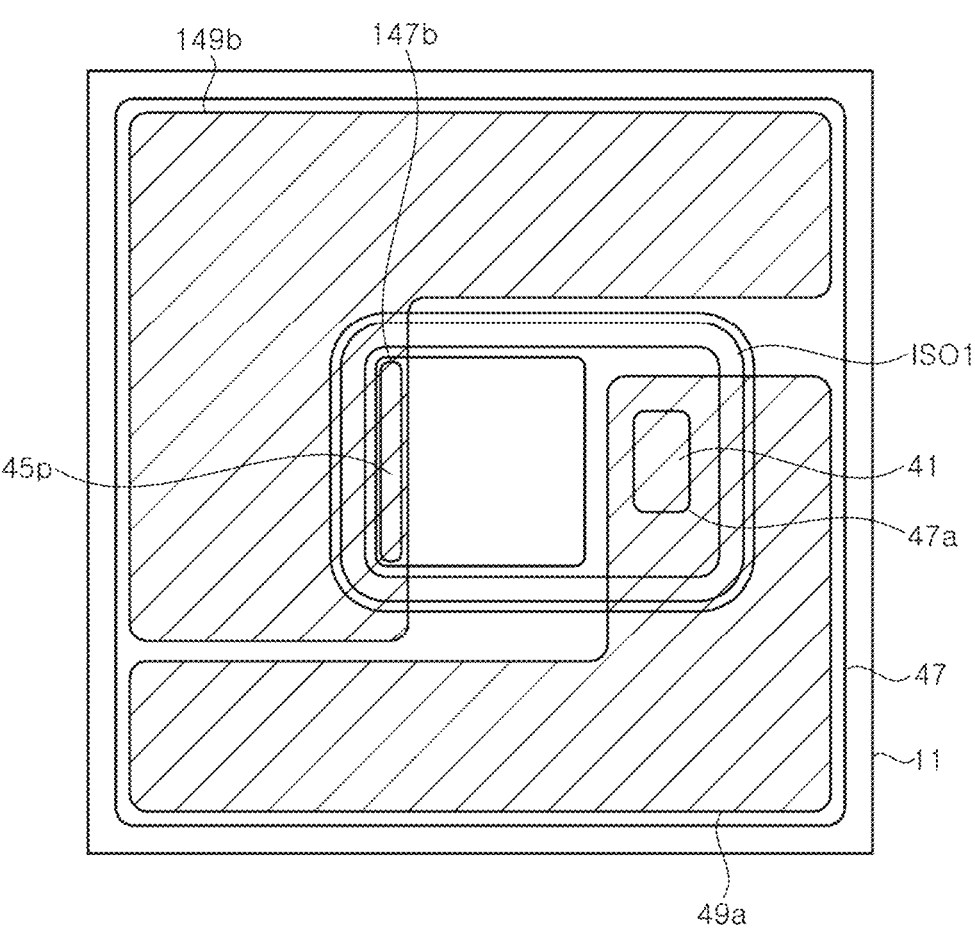
FIGS. 18A, 18B, and 18C are schematic plan views illustrating a light emitting device according to an exemplary embodiment, where.
Figure 18B:
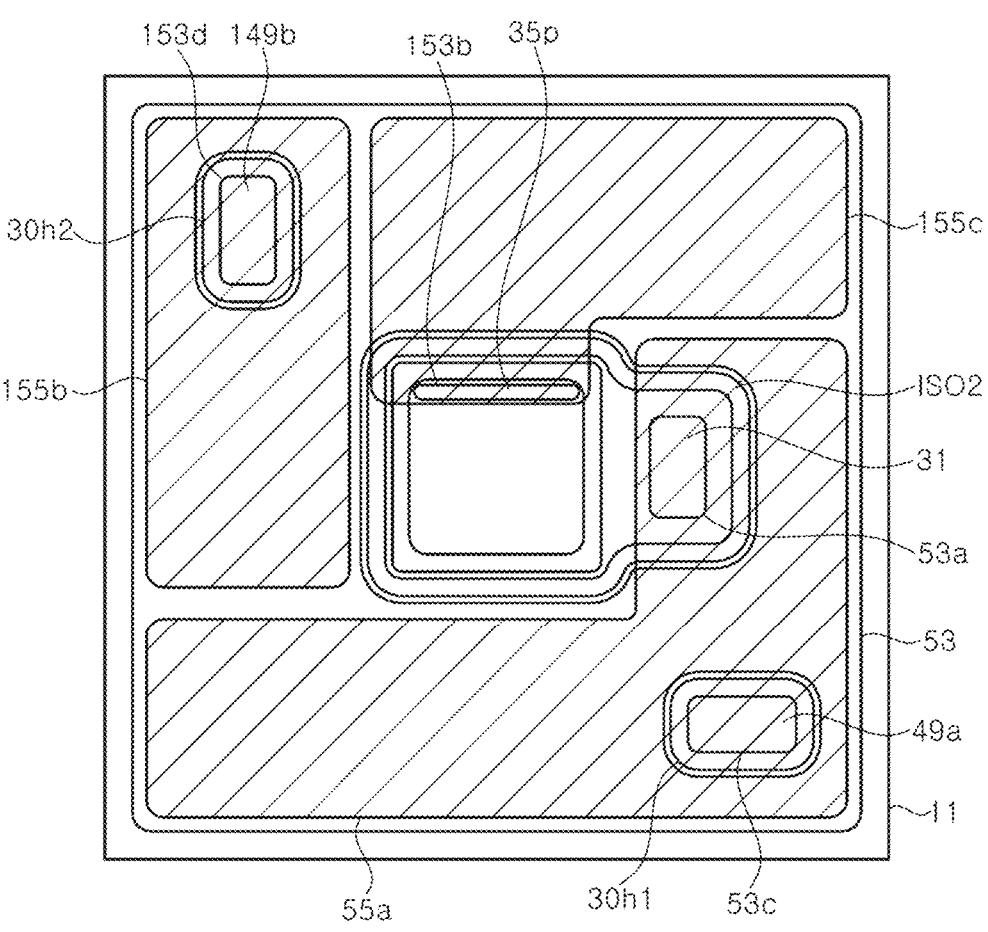
Figure 18C:
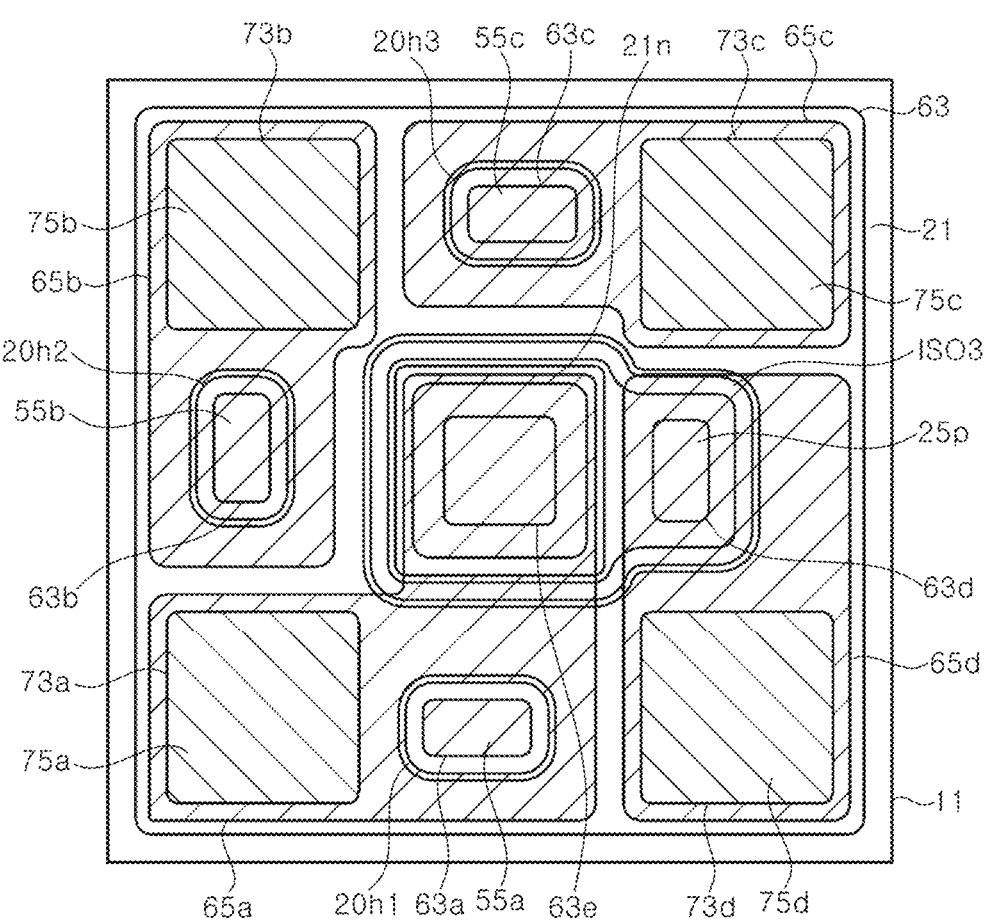

FIGS. 18A, 18B, and 18C are schematic plan views illustrating a light emitting device according to an exemplary embodiment. FIG. 18A shows a schematic plan view as viewed on a third LED stack, FIG. 18B shows a schematic plan view as viewed on a second LED stack, and FIG. 18C shows a schematic plan view as viewed on a first LED stack.

Referring to FIGS. 18A, 18B, and 18C, the light emitting device according to the exemplary embodiment is substantially similar to the light emitting device 100 described with reference to FIGS. 3A, 3B, 3C, 4A, 4B, and 4C, but there are some differences. In this exemplary embodiment, for the same configuration of the light emitting device as that of the light emitting device 100, repeated descriptions will be omitted to avoid redundancy, and differences will be described in detail.

First, referring to FIG. 18A, unlike the opening 47*b* of FIG. 3A, an opening 147*b* of a first insulation layer 47 exposes a third transparent electrode 45*p* in an elongated shape along one edge of the third transparent electrode 45*p*. A length of the exposed third transparent electrode 45*p* may be 80% or more of a length of one edge. As shown in FIG. 18A, the opening 147*b* may be elongated in the vertical direction.

A third-2 connector 149*b* is electrically connected to the third transparent electrode 45*p* exposed through the opening 147*b*. The third-2 connector 149*b* may cover an entire opening 147*b* and thus, may contact all of exposed portions of the third transparent electrode 45*p*. As the third-2 connector 149*b* contacts relatively lengthily near one edge of the third transparent electrode 45*p*, current may be easily spread over a large area of the third transparent electrode 45*p*, and thus, light efficiency may be improved.

Referring to FIG. 18B, unlike the opening 53*b* of FIG. 3B, an opening 153*b* of a second insulation layer 53 exposes a second transparent electrode 35*p* in an elongated shape along one edge of the second transparent electrode 35*p*. A length of the exposed second transparent electrode 35*p* may be 80% or more of a length of one edge. As shown in FIG. 18B, the opening 153*b* may be elongated in a direction perpendicular to the opening 147*b* of the first insulation layer 47. However, in another exemplary embodiment, the opening 153*b* may be overlapped with the opening 147*b*.

Meanwhile, an opening 153*d* of the second insulation layer 53 may be formed lengthily in the vertical direction unlike the opening 53*d* of FIG. 3B, and for this purpose, a through hole 30*h*2 is also formed lengthily in the vertical direction. By forming the opening 153*d* of the second insulation layer 53 lengthwise in the vertical direction, it is possible to prevent a second intermediary connector 155*b* from invading toward a second-2 connector 155*c*, and thus, a shape of the second-2 connector 155*c* may be simplified.

The second-2 connector 155*c* is electrically connected to the second transparent electrode 35*p* exposed through the opening 153*b*. The second-2 connector 155*c* may cover an entire opening 153*b* and thus, may contact all of exposed portions of the second transparent electrode 35*p*. As the second-2 connector 155c contacts relatively lengthily near one edge of the second transparent electrode 35p, current may be easily spread over a large area of the second transparent electrode 35p, and thus, light efficiency may be improved.

In the illustrated exemplary embodiment, a portion in which the second-2 connector 155c contacts the second transparent electrode 35p is formed lengthwise in a direction orthogonal to a portion in which the third-2 connector 149b contacts the third transparent electrode 45p. However, in another exemplary embodiment, the portion in which the second-2 connector 155c contacts the second transparent electrode 35p may be formed to be substantially overlapped with the portion in which the third-2 connector 149b contacts the third transparent electrode 45p. As such, when light generated in the first LED stack 20 passes through the second LED stack 30 and the third LED stack 40, an area blocked by the second-2 connector 155c and the third-2 connector 149b may be reduced.

Figure 19A:
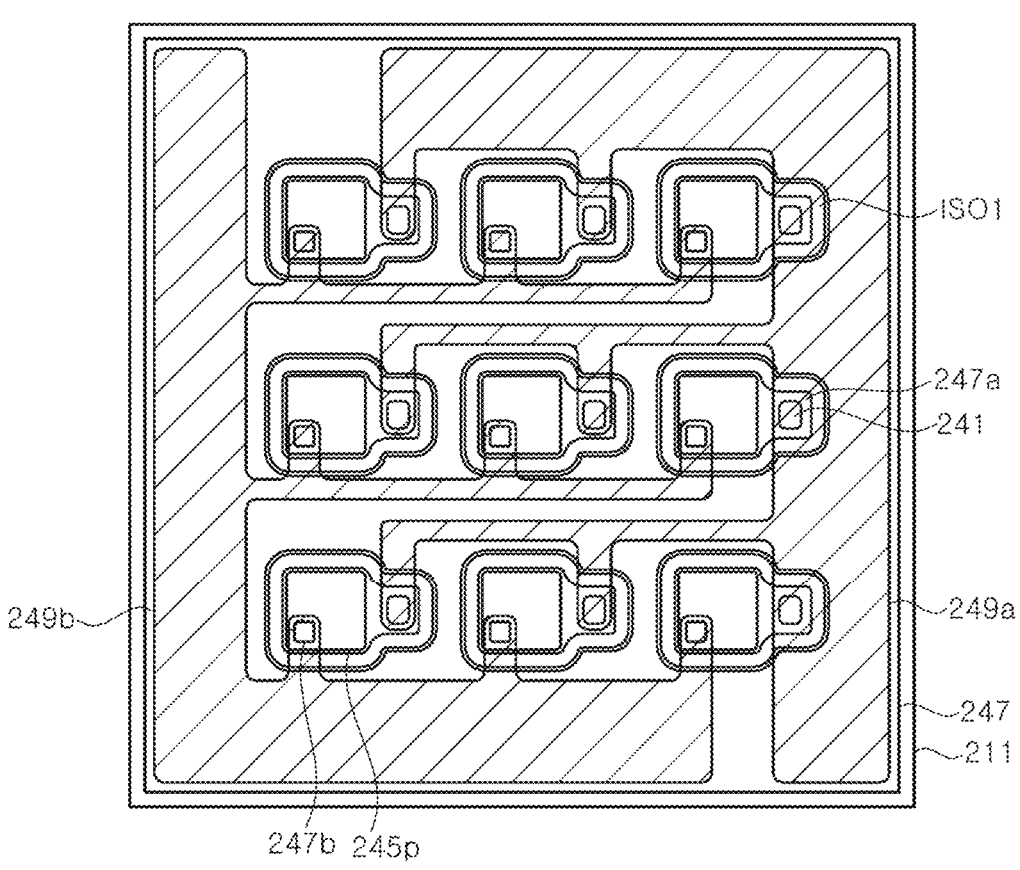
FIGS. 19A, 19B, and 19C are schematic plan views illustrating a light emitting device according to an exemplary embodiment, where.
Figure 19B:
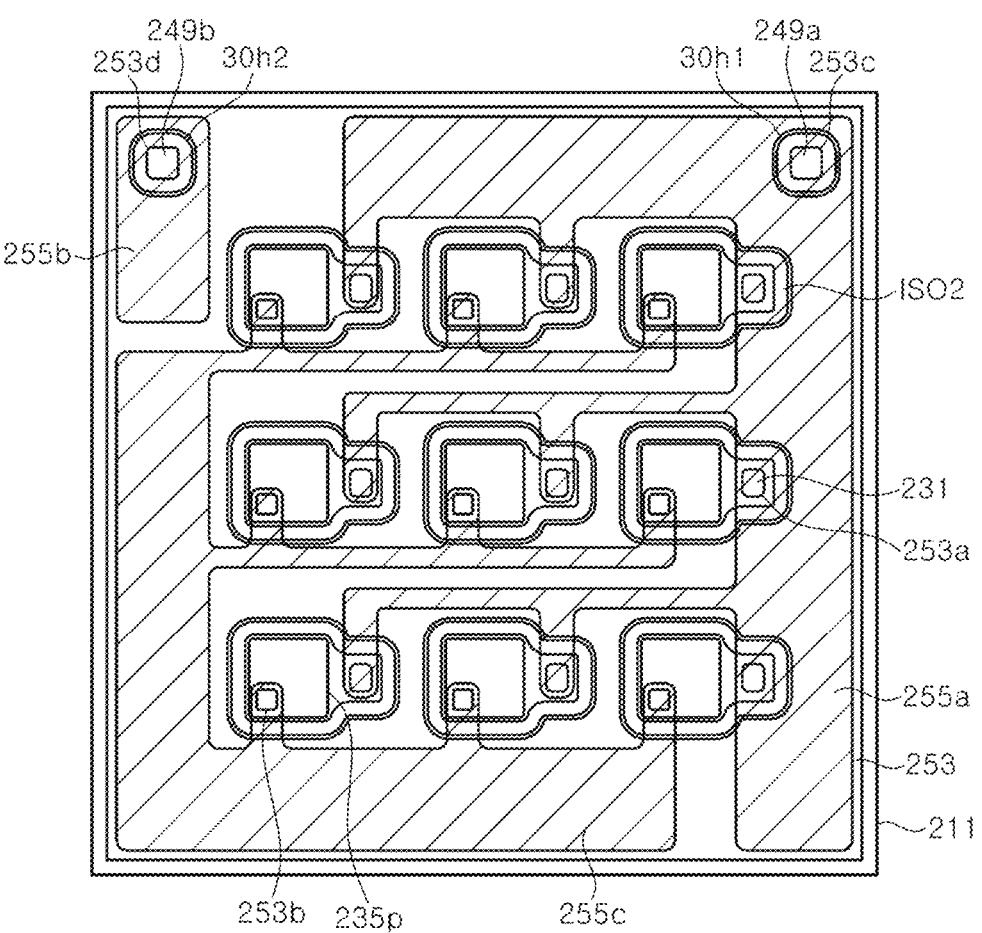
Figure 19C:
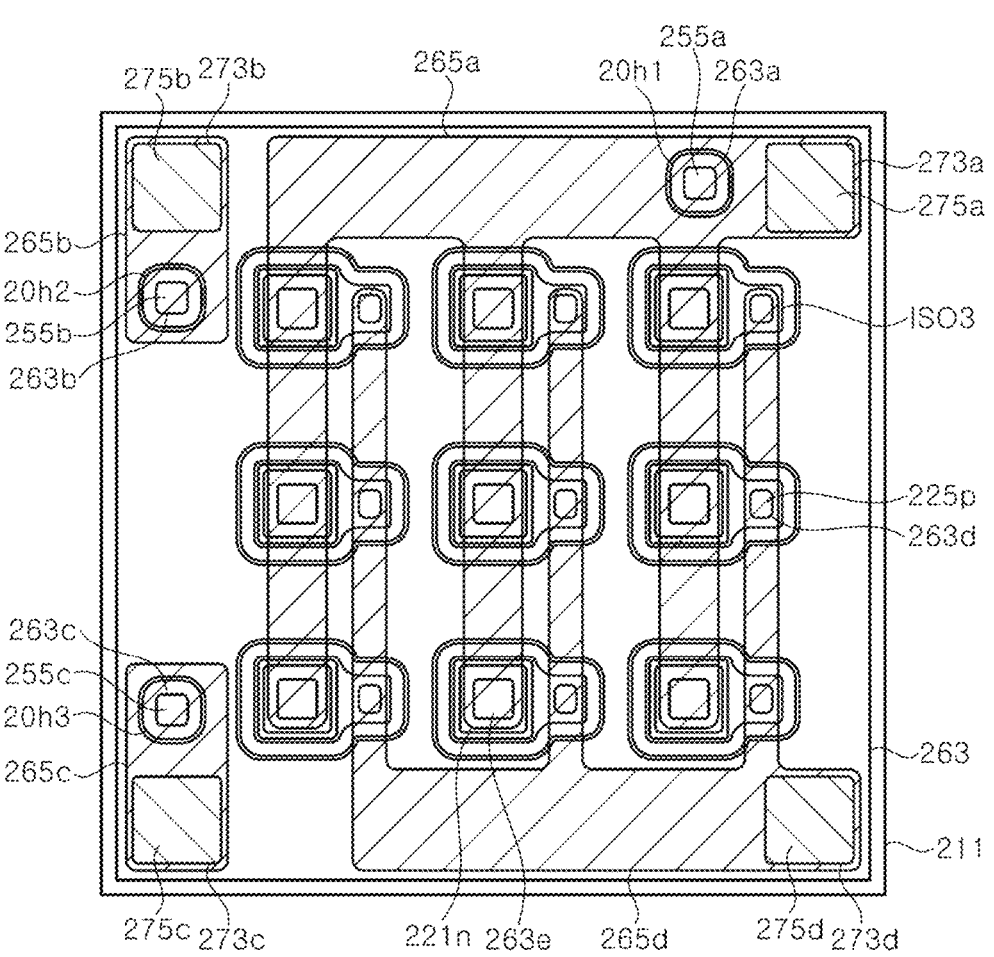

FIGS. 19A, 19B, and 19C are schematic plan views illustrating a light emitting device according to an exemplary embodiment.

Referring to FIGS. 19A, 19B, and 19C, the light emitting device according to the exemplary embodiment is different from that of the light emitting device 100 described above in that it includes a plurality of light generation regions.

The light generation regions are surrounded by a peripheral region on a substrate 211, respectively, and the peripheral regions may be separated from each of the light generation regions by isolation regions ISO1, ISO2, and ISO3. The light generation regions of the first, second, and third LED stacks 20, 30, and 40 may be arranged in a matrix shape so as to be overlapped with one another, as shown in FIGS. 19A, 19B, and 19C.

As shown in FIG. 19A, a first insulation layer 247 includes openings 247a exposing a first conductivity type semiconductor layer 241 near each of the light generation regions, and openings 247b exposing a third transparent electrode 245p on each of the light generation regions.

Meanwhile, a third-1 connector 249a is commonly electrically connected to the first conductivity type semiconductor layer 241 exposed through the openings 247a. A third-2 connector 249b is spaced apart from the third-1 connector 249a and is commonly electrically connected to the third transparent electrodes 245p exposed through the openings 247b.

As shown in FIG. 19B, a second insulation layer 253 includes openings 253a exposing first conductivity type semiconductor layers 231 near the light generation regions and openings 253b exposing second transparent electrodes 235p on the light generation regions. In addition, the second insulation layer 253 has openings 253c and 253d exposing the third-1 connector 249a and the third-2 connector 249b in through holes 30h1 and 30h2.

A second-1 connector 255a is commonly electrically connected to the first conductivity type semiconductor layers 231 exposed through the openings 253a, and further, is electrically connected to the third-1 connector 249a exposed through the openings 253c. A second-2 connector 255c is commonly electrically connected to the second transparent electrodes 235p exposed through the openings 253b. Meanwhile, a second intermediary connector 255b is electrically connected to the third-2 connector 249b exposed through the opening 253d.

As shown in FIG. 19C, a third insulation layer 263 has openings 263a, 263b, and 263c exposing the second-1 connector 255a, the second intermediary connector 255b, and the second-2 connector 255c via through holes 20h1, 20h2, and 20h3. The third insulation layer 263 also has openings 263d exposing first transparent electrodes 225p near the light generation regions of the second LED stack and openings 263e exposing first ohmic electrodes 221n on the light generation regions.

A first-1 connector 265a is commonly electrically connected to the first ohmic electrodes 221n exposed through the openings 263e, and in addition, is electrically connected to the second-1 connector 255a exposed through the openings 263a. A first-2 connector 265d is commonly electrically connected to the first transparent electrodes 225p exposed through the openings 263d.

Meanwhile, a first-1 intermediary connector 265b is electrically connected to the second intermediary connector 255b exposed through the opening 263b, and a first-2 intermediary connector 265c is electrically connected to the second-2 connector 255c exposed through the opening 263c.

An insulation layer 273 covers the first-1 connector 265a, the first-1 intermediary connector 265b, the first-2 intermediary connector 265c, and the first-2 connector 265d. The insulation layer 273 has openings 273a, 273b, 273c, and 273d exposing the first-1 connector 265a, the first-1 intermediary connector 265b, the first-2 intermediary connector 265c, and the first-2 connector 265d. The openings 273a, 273b, 273c, and 273d are disposed on the peripheral region of the first LED stack 20.

Bump pads 275a, 275b, 275c, and 275d are disposed in the openings 273a, 273b, 273c, and 273d, respectively. The first bump pad 275a is electrically connected to the first-1 connector 265a. Accordingly, the first bump pad 275a is commonly electrically connected to the first conductivity type semiconductor layers of the light generation regions of the first, second, and third LED stacks 20, 30, and 40. The second bump pad 275b is commonly electrically connected to the second conductivity type semiconductor layers of the light generation regions of the third LED stack 40. The third and fourth bump pads 275c and 275d are commonly electrically connected to the second conductivity type semiconductor layers of the light generation regions of the second and third LED stacks, respectively.

The light generation regions of the first LED stack 20 are connected in parallel between the first bump pad 275a and the fourth bump pad 275d, the light generation regions of the second LED stack 30 are connected in parallel between the first bump pad 275a and the third bump pad 275c, and the light generation regions of the third LED stack 40 are connected in parallel between the first bump pad 275a and the second bump pad 275b. As such, the first LED stack 20, the second LED stack 30, and the third LED stack 40 may be independently driven, and the plurality of light generation regions in each of the LED stacks may be driven together.

As such, even if a defect occurs in one of the light generation regions, the light emitting device may be used as long as other light generation regions operate, thereby improving the yield of the light emitting device.

Figure 20A:
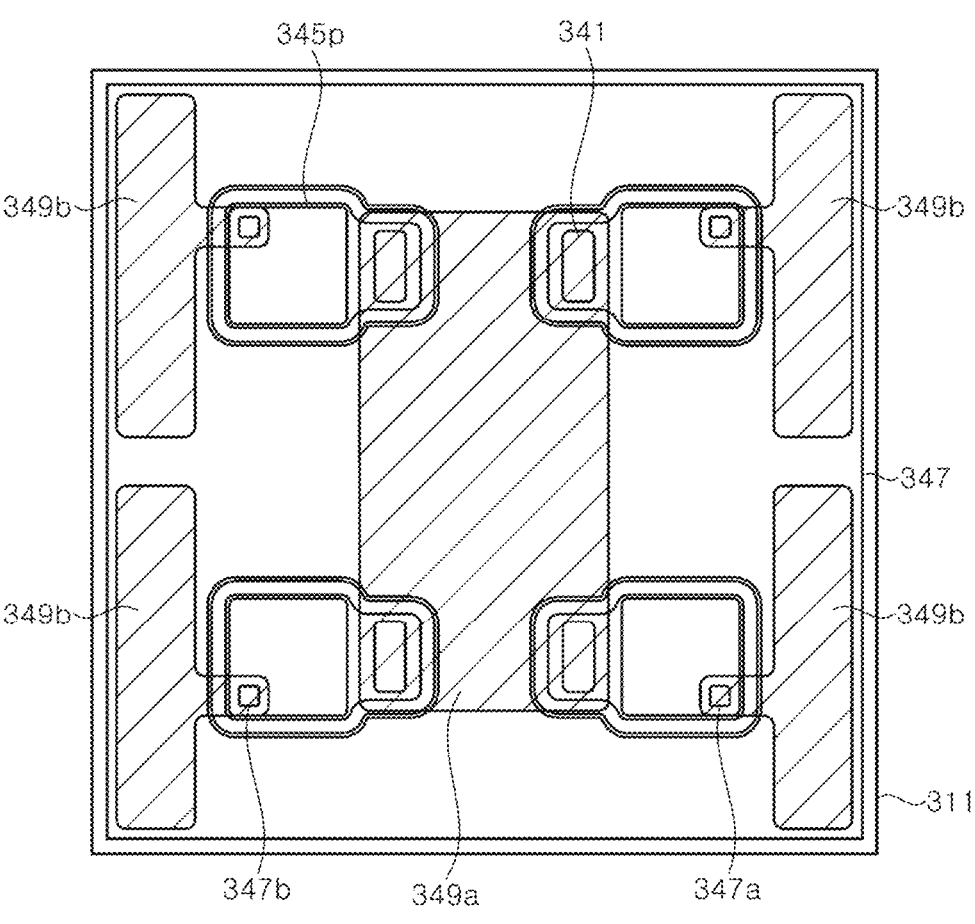
FIGS. 20A, 20B, and 20C are schematic plan views illustrating a light emitting device according to an exemplary embodiment, where.
Figure 20B:
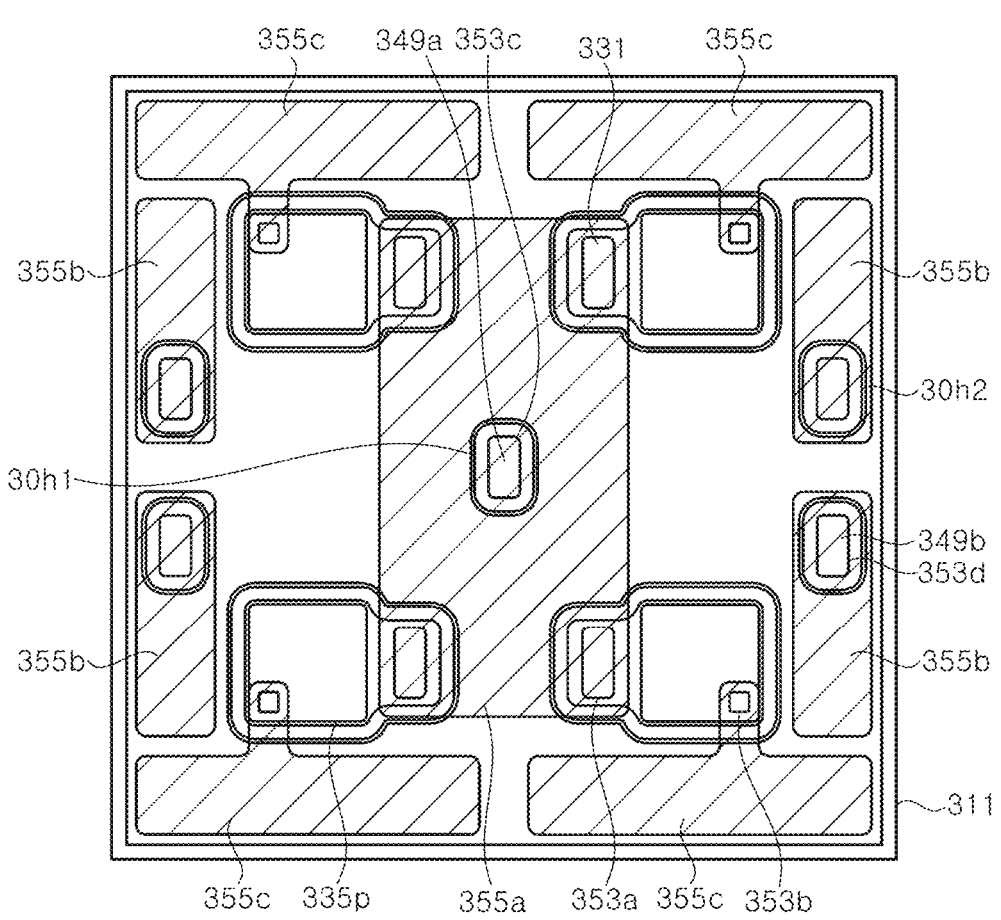
Figure 20C:
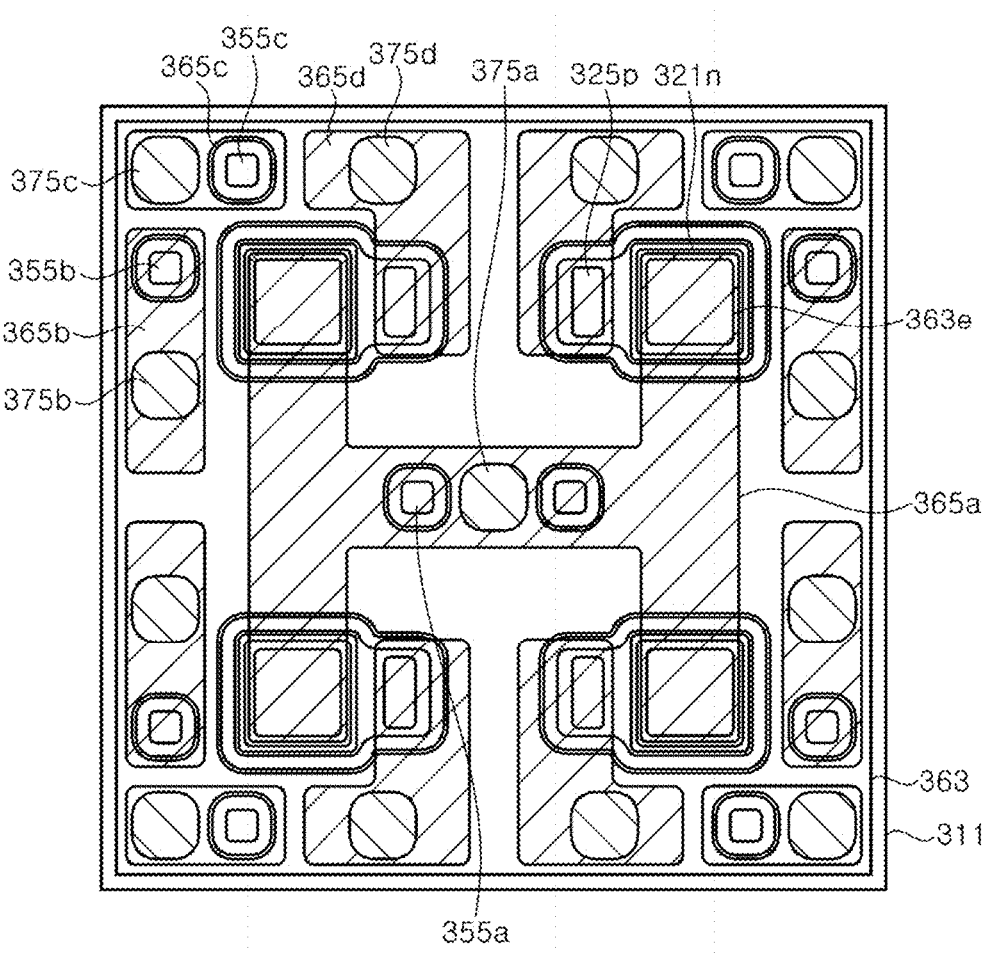

FIGS. 20A, 20B, and 20C are schematic plan views illustrating a light emitting device according to an exemplary embodiment.

Referring to FIGS. 20A, 20B, and 20C, the light emitting device according to the exemplary embodiment has a plurality of light generation regions, similar to the light emitting device described with reference to FIGS. 19A, 19B, and 19C. Each of the light generation regions is surrounded by a peripheral region on a substrate 311, and the peripheral region may be separated from each of the light generation regions by isolation regions. The light generation regions of first, second, and third LED stacks 20, 30, and 40 may be arranged in a matrix shape to be overlapped with one another, as shown in FIGS. 20A, 20B, and 20C. However, the light generation regions may be arranged to have a mirror surface symmetric structure with one another.

As shown in FIG. 20A, a first insulation layer 347 includes openings 347a exposing a first conductivity type semiconductor layer 341 near each of the light generation regions and openings 347b exposing a third transparent electrode 345p on each of the light generation regions.

Meanwhile, a third-1 connector 349a is commonly electrically connected to the first conductivity type semiconductor layers 341 exposed through the openings 347a. As shown in FIG. 20A, the third-1 connector 349a may be disposed in a center of the light emitting device. A plurality of third-2 connectors 349b is separated from the third-1 connector 349a and is electrically connected to the third transparent electrodes 345p exposed through the openings 347b, respectively.

As shown in FIG. 20B, a second insulation layer 353 includes openings 353a exposing first conductivity type semiconductor layers 331 near the light generation regions and openings 353b exposing second transparent electrodes 335p on the light generation regions. In addition, the second insulation layer 353 has openings 353c and 353d exposing the third-1 connector 349a and a third-2 connector 349b in through holes 30h1 and 30h2. The openings 353d may be disposed over each of the third-2 connectors 349b so as to expose a plurality of third-2 connectors 349b.

A second-1 connector 355a is commonly electrically connected to the first conductivity type semiconductor layers 331 exposed through the openings 353a, and further, is electrically connected to the third-1 connector 349a exposed through the openings 353c. Second-2 connectors 355c are electrically connected to the second transparent electrodes 335p exposed through the openings 353b, respectively. Meanwhile, second intermediary connectors 355b are electrically connected to the third-2 connectors 349b exposed through the openings 353d, respectively.

As shown in FIG. 20C, a third insulation layer 363 has openings exposing a second-1 connector 255a, a second intermediary connector 255b, and the second-2 connectors 355c, respectively, and in addition, has openings exposing first transparent electrodes 325p near the light generation regions of the second LED stack and openings 363e exposing first ohmic electrodes 321n on the light generation regions.

A first-1 connector 365a is commonly electrically connected to the first ohmic electrodes 321n exposed through the openings 363e, and in addition, is electrically connected to the second-1 connector 355a exposed through the openings. First-2 connectors 365d are electrically connected to the first transparent electrodes 325p exposed through the openings, respectively.

Meanwhile, first-1 intermediary connectors 365b are electrically connected to the second intermediary connectors 355b exposed through the openings, respectively, and first-2 intermediary connectors 365c are electrically connected to the second-2 connectors 355c exposed through openings 363c, respectively.

Bump pads 375a, 375b, 375c, and 375d are disposed on the first-1 connector 365a, the first-2 connectors 365d, the first-1 intermediary connectors 365b, and the first-2 intermediary connectors 365c, respectively. For example, the first bump pad 375a may be disposed on the first-1 connector 365a, the second bump pads 375b may be disposed on the first-1 intermediary connectors 365b, respectively, the third bump pads 375c may be disposed on the first-2 intermediary connectors 365c, respectively, and the fourth bump pads 375d may be disposed on the first-2 connectors 365d, respectively.

Meanwhile, although not shown in FIG. 20C, a protection insulation layer may cover the first-1 connector 365a, the first-2 connectors 365d, the first-1 intermediary connectors 365b, and the first-2 intermediary connectors 365c, and may have openings for forming bump pads 275a, 275b, 275c, and 275d.

According to the illustrated exemplary embodiment, since the first bump pad 275a and the second, third, and fourth bump pads 275b, 275c, and 275d are selected, each light generation region in each of the LED stack 20, 30, and 40 may be driven individually.

As such, even if a defect occurs in one of the light generation regions, other light generation regions may be used, thereby improving the yield of the light emitting device.

Figure 21:
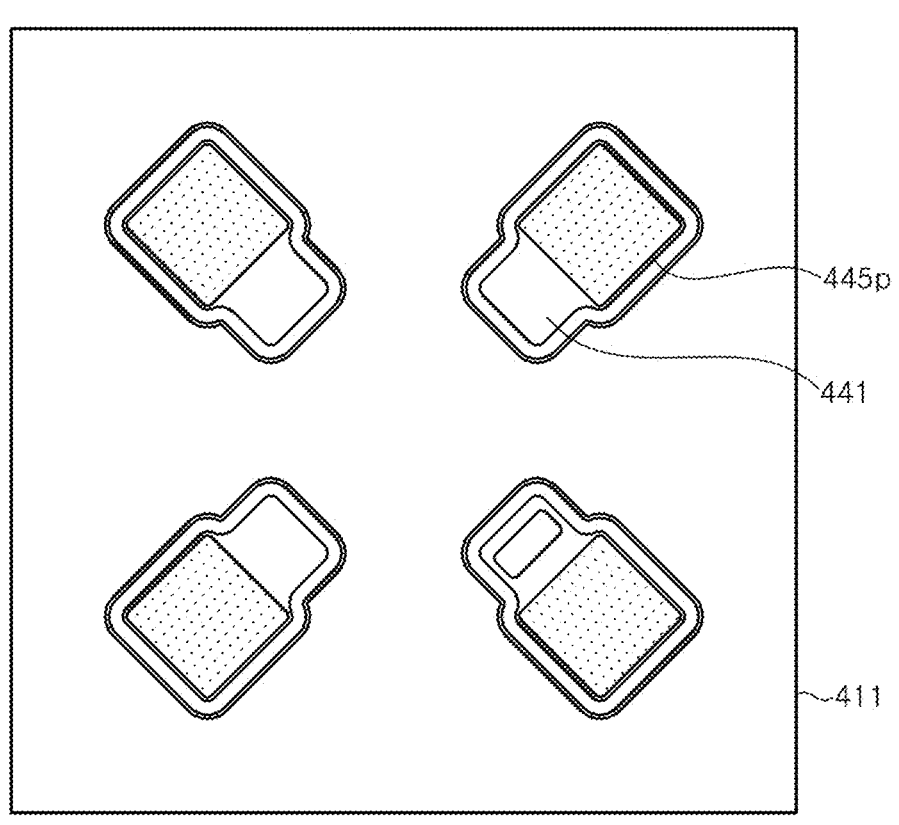
FIG. 21 is a schematic plan view illustrating a light emitting device according to an exemplary embodiment.

FIG. 21 is a schematic plan view illustrating a light emitting device according to an exemplary embodiment.

Referring to FIG. 21, the light emitting device according to the exemplary embodiment is substantially similar to the light emitting device described with reference to FIGS. 20A, 20B, and 20C, but light generation regions are disposed diagonally on a substrate 411 in this exemplary embodiment.

As shown in FIG. 21, the light generation regions may be disposed so as to face one another in diagonal directions of the light emitting device. Herein, the light generation region may be represented by a region of a third transparent electrode 445p, and a first conductivity type semiconductor layer 441 may be exposed around the light generation region.

Herein, only light generation regions of a third LED stack 40 are exemplarily shown, but in some forms, light generation regions of a second LED stack 30 and a first LED stack 20 may also be disposed so as to be overlapped with the light generation regions of the third LED stack 40.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting apparatus, comprising:
a circuit board;
a light emitting device including a first multiple layer region, a second multiple layer region, a third multiple layer region, and a peripheral region;
an electrode disposed between the circuit board and the light emitting device; and
connectors electrically connected to the light emitting device,
wherein:
the peripheral region includes a first type semiconductor layer,
the first multiple layer region is disposed between the electrode and the second multiple layer region,
the second multiple layer region is disposed between the first multiple layer region and the third multiple layer region, and configured to emit light having a first peak wavelength, the third multiple layer region is disposed on the second multiple layer region and, configured to emit light having a second peak wavelength, the connectors are disposed across the peripheral region and spaced apart from each other in a lateral direction, the first peak wavelength is longer than the second peak wavelength, and the light emitting device includes a side surface that is inclined with respect to an upper surface of the light emitting device.

2. The light emitting apparatus according to claim 1, wherein the first multiple layer region is surrounded by the peripheral region.

3. The light emitting apparatus according to claim 2, wherein the light emitting device further comprises a transparent electrode disposed between the third multiple layer region and one of the connectors that is electrically connected to the transparent electrode.

4. The light emitting apparatus according to claim 1, wherein the light emitting device is mirror symmetric in a top view.

5. The light emitting apparatus according to claim 1, further comprising another light emitting device disposed adjacent to the light emitting device, wherein the light emitting device and the another light emitting device are electrically connected in parallel.

6. A light emitting apparatus, comprising:
a circuit board;
a light emitting device including a first multiple layer region, a second multiple layer region, a third multiple layer region, and a peripheral region;
an electrode disposed between the circuit board and the light emitting device; and
connectors electrically connected to the light emitting device,
wherein:
the first multiple layer region is surrounded by the peripheral region;
the first multiple layer region is disposed between the electrode and the second multiple layer region;
the second multiple layer region is disposed between the first multiple layer region and the third multiple layer region, and configured to emit light having a peak wavelength corresponding to green color;
the third multiple layer region is disposed on the second multiple layer region and configured to emit light having a peak wavelength corresponding to blue color;
the connectors are disposed across the peripheral region, and spaced part from each other in a lateral direction; and
the light emitting device includes a side surface that is inclined with respect to an upper surface of the light emitting device.

7. The light emitting apparatus according to claim 6, wherein the peripheral region includes a first type semiconductor layer.

8. The light emitting apparatus according to claim 7, wherein the light emitting device further comprises a transparent electrode disposed between the third multiple layer region and one of the connectors that is electrically connected to the transparent electrode.

9. The light emitting apparatus according to claim 6, wherein the light emitting device is mirror symmetric in a top view.

10. The light emitting apparatus according to claim 6, further comprising another light emitting device disposed adjacent to the light emitting device, wherein the light emitting device and the another light emitting device are electrically connected in parallel.

11. A light emitting apparatus, comprising:
a circuit board;
a light emitting device including a first multiple layer region, a second multiple layer region, a third multiple layer region, and a peripheral region;
an electrode disposed between the circuit board and the light emitting device; and
connectors electrically connected to the light emitting device,
wherein:
the first multiple layer region is surrounded by the peripheral region;
the first multiple layer region is disposed between the electrode and the second multiple layer region;
the second multiple layer region is disposed between the first multiple layer region and the third multiple layer region, and configured to emit light having a first peak wavelength;
the third multiple layer region is disposed on the second multiple layer region and configured to emit light having a second peak wavelength;
the connectors are disposed across the peripheral region and spaced part from each other in a lateral direction;
the first peak wavelength is longer than the second peak wavelength; and
the light emitting device includes a side surface that is inclined with respect to an upper surface of the light emitting device.

12. The light emitting apparatus according to claim 11, wherein the peripheral region includes a first type semiconductor layer.

13. The light emitting apparatus according to claim 12, wherein the light emitting device further comprises a transparent electrode disposed between the third multiple layer region and one of the connectors that is electrically connected to the transparent electrode.

14. The light emitting apparatus according to claim 11, wherein the light emitting device is mirror symmetric in a top view.

15. The light emitting apparatus according to claim 11, further comprising another light emitting device disposed adjacent to the light emitting device, wherein the light emitting device and the another light emitting device are electrically connected in parallel.

* * * * *